(12) United States Patent
Yaegashi

(10) Patent No.: US 12,481,228 B2
(45) Date of Patent: Nov. 25, 2025

(54) OBJECT ALIGNMENT METHOD, IMPRINT METHOD, ARTICLE MANUFACTURING METHOD, DETECTION APPARATUS, IMPRINT APPARATUS, MOLD, AND SUBSTRATE

(71) Applicant: CANON KABUSHIKI KAISHA, Tokyo (JP)

(72) Inventor: Kenji Yaegashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 273 days.

(21) Appl. No.: 18/180,610

(22) Filed: Mar. 8, 2023

(65) Prior Publication Data

US 2023/0294351 A1    Sep. 21, 2023

(30) Foreign Application Priority Data

Mar. 15, 2022  (JP) .................................. 2022-040250

(51) Int. Cl.
*G03F 9/00*      (2006.01)
*G03F 7/00*      (2006.01)

(52) U.S. Cl.
CPC .......... *G03F 9/7076* (2013.01); *G03F 7/0002* (2013.01); *G03F 9/7042* (2013.01)

(58) Field of Classification Search
CPC .............................. G03F 9/7042; G03F 9/7076
See application file for complete search history.

(56) References Cited

U.S. PATENT DOCUMENTS

| 2007/0242272 | A1* | 10/2007 | Suehira | ..................... | G03F 9/00 356/401 |
| 2015/0235880 | A1* | 8/2015 | Inada | .................... | G06T 7/0004 348/87 |
| 2020/0117084 | A1* | 4/2020 | Sato | ....................... | G03F 7/0002 |
| 2020/0301293 | A1* | 9/2020 | Mitsugi | ..................... | G03F 1/42 |

FOREIGN PATENT DOCUMENTS

| JP | 2015154008 A | 8/2015 |
| JP | 2019158516 A | 9/2019 |
| KR | 20150097415 A | 8/2015 |
| KR | 20150130501 A | 11/2015 |

* cited by examiner

*Primary Examiner* — John J DeRusso
(74) *Attorney, Agent, or Firm* — Canon U.S.A., Inc. IP Division

(57) ABSTRACT

An alignment method of aligning a first object and a second object includes detecting a moire fringe formed by a mark of the first object and a mark of the second object by using a detection unit, detecting an evaluation mark for correcting a detection result of the moire fringe, by the detection unit, and acquiring a detection result of the evaluation mark, determining a relative position of the mark of the first object and the mark of the second object by correcting a detection result of the moire fringe by use of the detection result of the evaluation mark, and aligning the first object and the second object based on the relative position. The evaluation mark is provided in at least one of the first object and the second object.

9 Claims, 16 Drawing Sheets

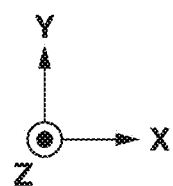

Mrm

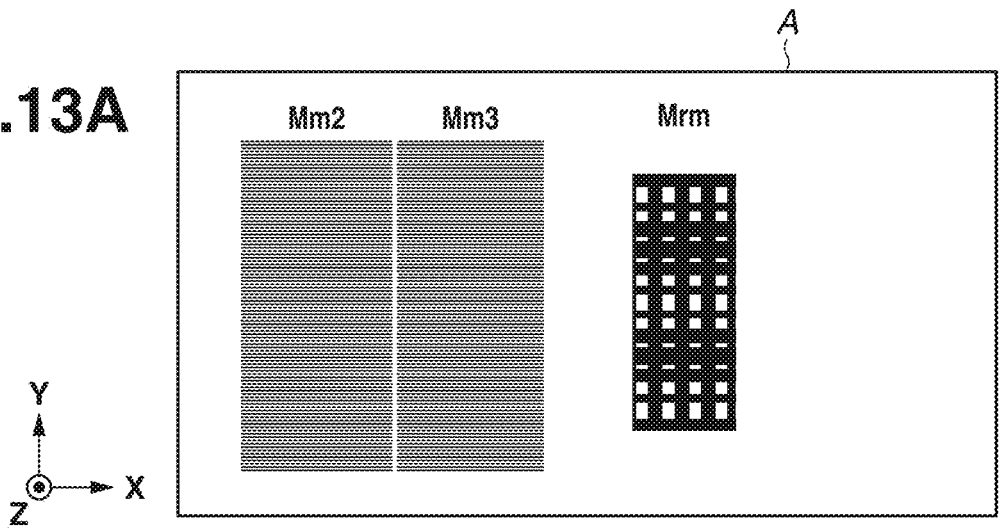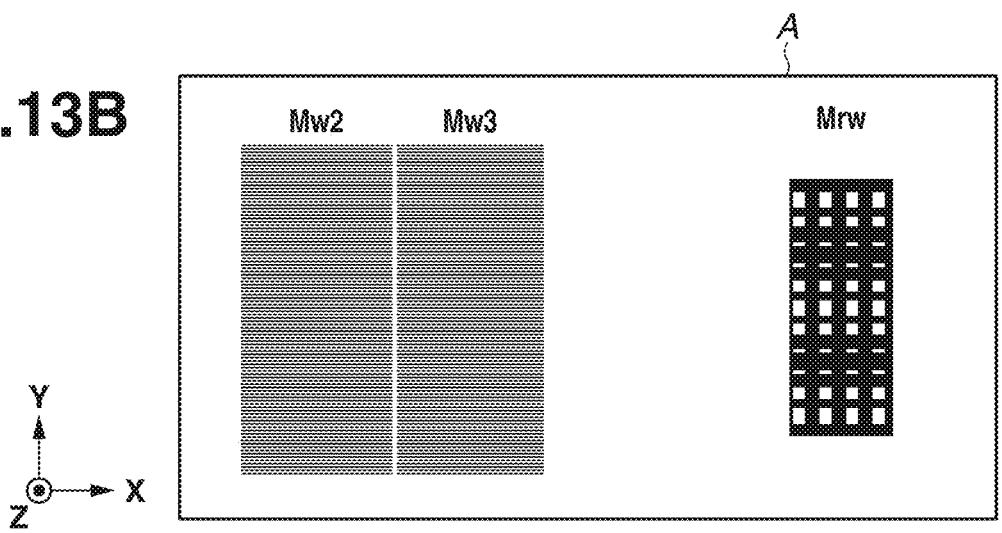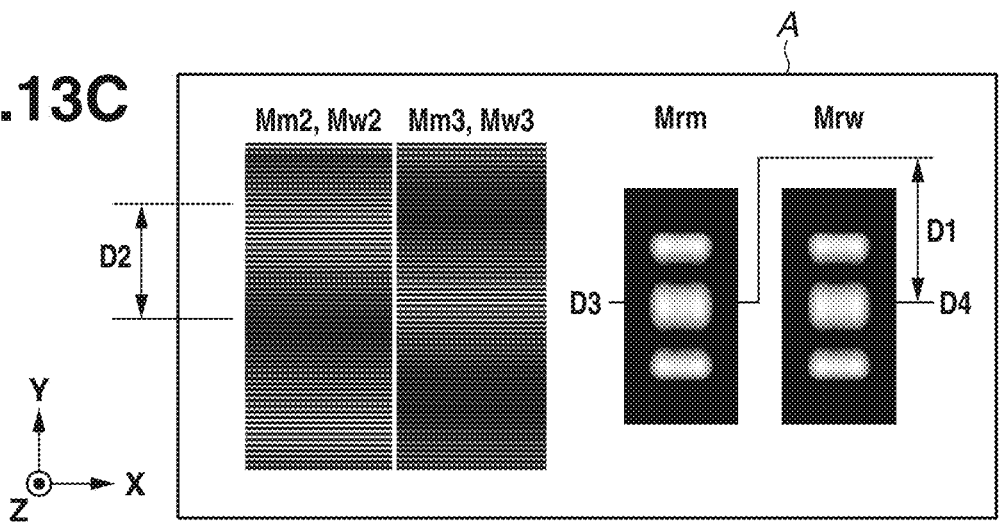

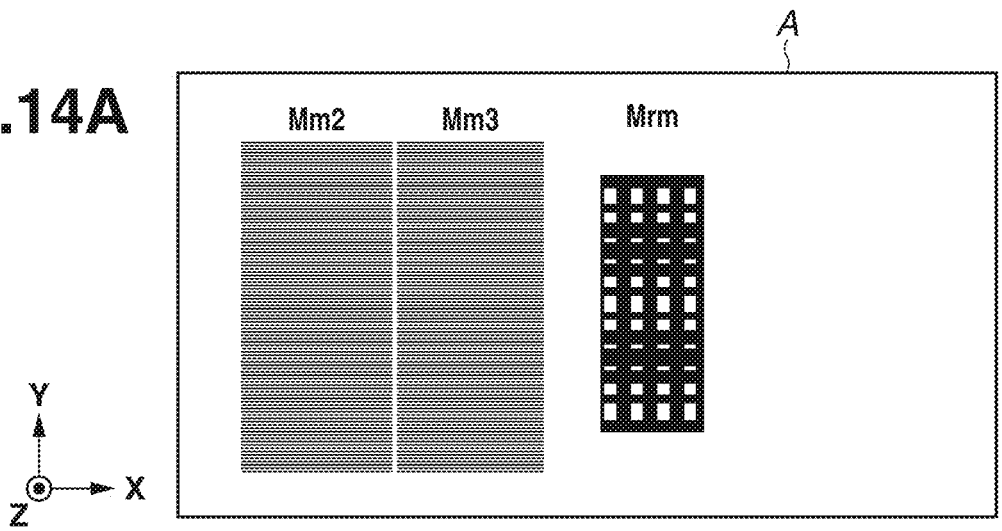
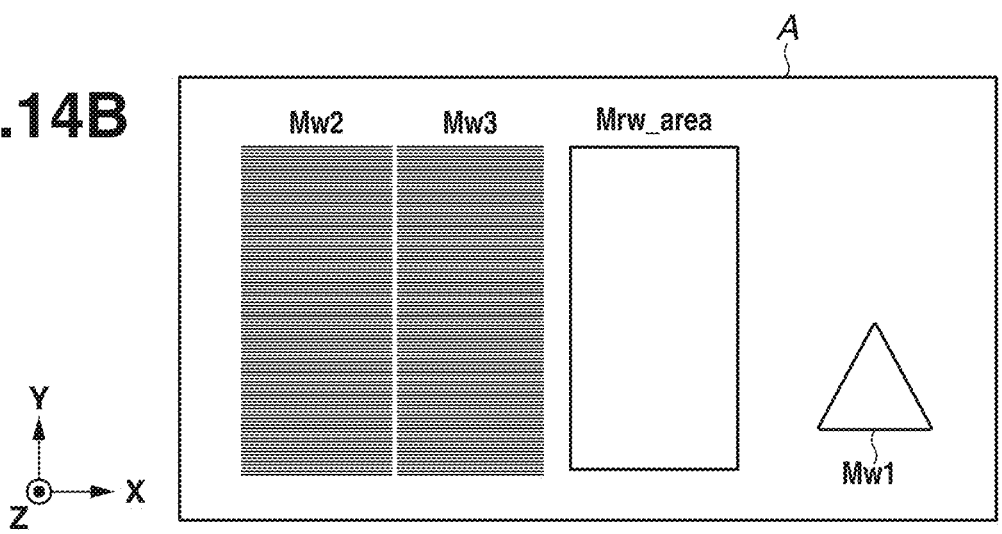
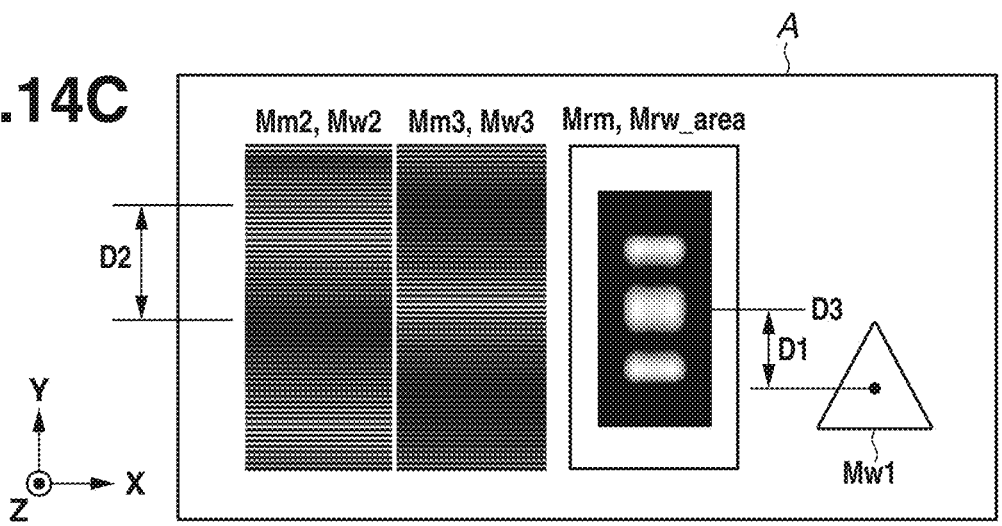

OBJECT ALIGNMENT METHOD, IMPRINT METHOD, ARTICLE MANUFACTURING METHOD, DETECTION APPARATUS, IMPRINT APPARATUS, MOLD, AND SUBSTRATE

BACKGROUND OF THE INVENTION

Field of the Invention

The present disclosure relates to an object alignment method, an imprint method, an article manufacturing method, a detection apparatus, an imprint apparatus, a mold, and a substrate.

Description of the Related Art

As one of lithography apparatuses that forms a pattern on a substrate, an imprint apparatus has attracted attention. The imprint apparatus cures an imprint material (composition) on the substrate in a state where a mold and the imprint material are in contact with each other, separates the mold from the cured imprint material, thereby forming the pattern of the imprint material on the substrate.

In the imprint apparatus, for example, a detection unit may detect a moire image (moire fringe) formed by a mark (mold mark) provided in the mold and a mark (substrate mark) provided in the substrate, and the mold and the substrate are aligned based on a detection result. Japanese Patent Application Laid-Open No. 2015-154008 discusses that a reference mark that generates a sine-wave signal, which is similar to the moire image formed by the mold mark and the substrate mark, is provided in a reference plate disposed on a substrate stage. Further, Japanese Patent Application Laid-Open No. 2015-154008 discusses a method of evaluating performance of the detection unit based on a result of detection (imaging) of the reference mark by the detection unit.

An evaluation result of the detection unit obtained by detection of the reference mark by the detection unit discussed in Japanese Patent Application Laid-Open No. 2015-154008 is varied due to the detection unit and a substrate manufacturing process. If performance of the detection unit when the detection unit detects the moire image formed by the mold mark and the substrate mark cannot be accurately evaluated due to the variation, accuracy of the detection result of the moire image is deteriorated.

SUMMARY OF THE INVENTION

The present disclosure is directed to an advantageous technique for obtaining a detection result of a moire image with high accuracy and accurately aligning a mold and a substrate.

According to an aspect of the present disclosure, an alignment method of aligning a first object and a second object includes detecting a moire fringe formed by a mark of the first object and a mark of the second object by using a detection unit, detecting an evaluation mark for correcting a detection result of the moire fringe, by the detection unit, and acquiring a detection result of the evaluation mark, determining a relative position of the mark of the first object and the mark of the second object by correcting a detection result of the moire fringe by use of the detection result of the evaluation mark, and aligning the first object and the second object based on the relative position, wherein the evaluation mark is provided in at least one of the first object and the second object and has a plurality of pattern elements arranged with an interval not more than a resolution of the detection unit.

Further features of the present disclosure will become apparent from the following description of exemplary embodiments with reference to the attached drawings.

BRIEF DESCRIPTION OF THE DRAWINGS

FIGS. 13A to 13C are diagrams illustrating configuration examples of marks according to a third exemplary embodiment.

FIGS. 14A to 14C are diagrams illustrating configuration examples of marks according to a fourth exemplary embodiment.

DESCRIPTION OF THE EMBODIMENTS

Figure 1:
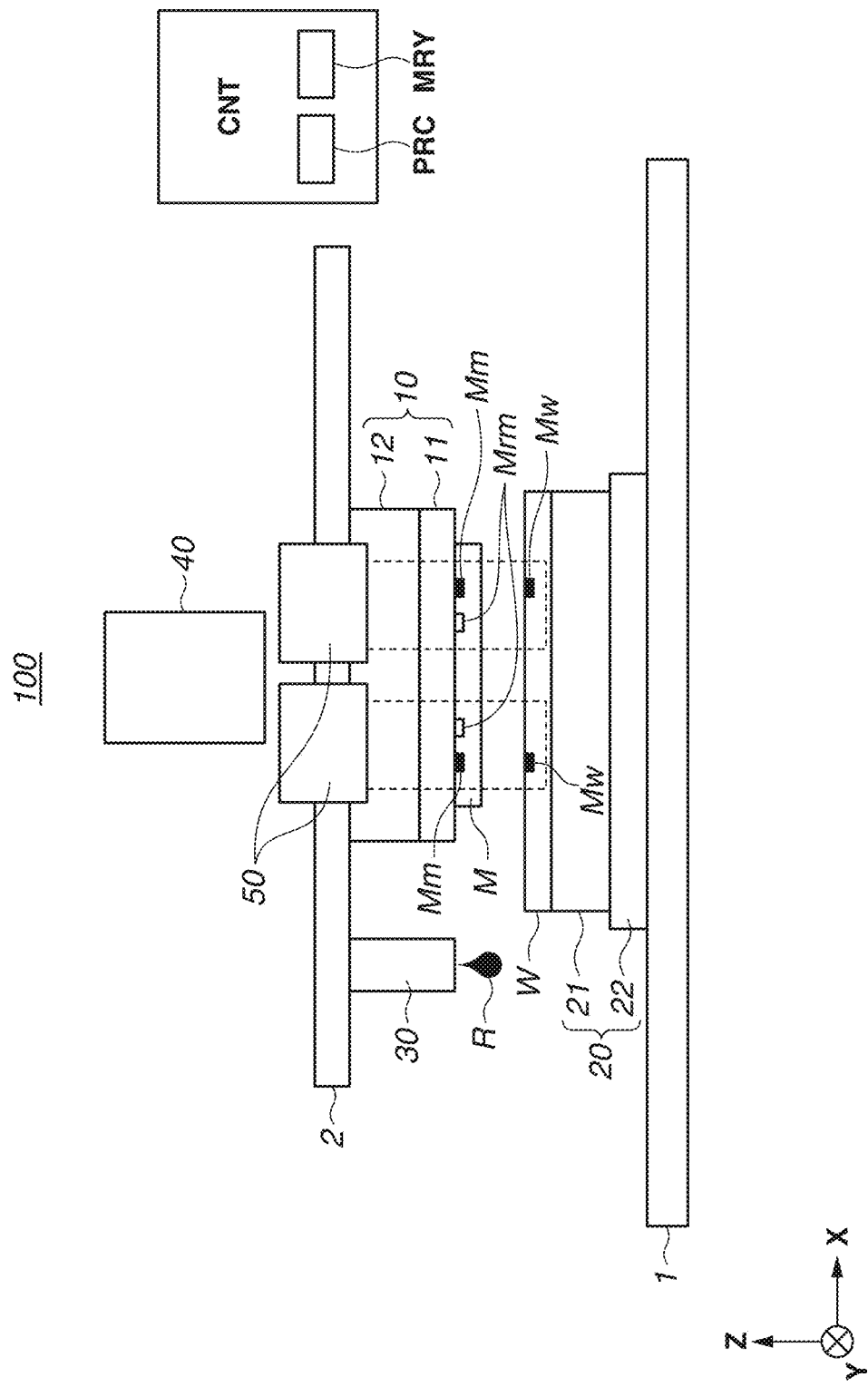
FIG. 1 is a diagram illustrating a configuration of an imprint apparatus.

Some exemplary embodiments are described in detail below with reference to the accompanying drawings.

A first exemplary embodiment is described. An imprint apparatus is an apparatus that brings a mold into contact with an imprint material (composition) supplied to a member and applies curing energy to the imprint material, thereby forming a pattern of a cured material to which a depression-protrusion pattern of the mold is transferred. For example, the imprint apparatus supplies the imprint material to the substrate and cures the imprint material in a state where the mold having the depression-protrusion pattern is in contact with the imprint material on the substrate. Then, the imprint apparatus increases a space between the mold and the substrate, and separates the mold from (demolds) the cured imprint material, thereby forming a pattern layer of the imprint material on the substrate. Such a series of processes is called "imprint processing".

As the imprint material, a curable composition (also referred to as resin in uncured state) cured by receiving curing energy is used. As the curing energy, an electromagnetic wave, heat, or the like is used. The electromagnetic wave is, for example, light such as infrared rays, visible rays, and ultraviolet rays having a wavelength selected from a range of 10 nm or more to 1 mm or less.

The curable composition is a composition cured by light irradiation or heating. Among the curable compositions, a photocurable composition cured by light contains at least a polymerizable compound and a photopolymerization initiator, and may contain a non-polymerizable compound or a solvent as necessary. The non-polymerizable compound is at least one material selected from a group including a sensitizer, a hydrogen donor, an internal mold release agent, a surfactant, an antioxidant, and a polymer component.

The imprint material is applied to the substrate in a film shape by a spin coater or a slit coater.

Alternatively, the imprint material may be applied to the substrate in a droplet shape or in an island shape or a film shape formed by a plurality of droplets connected to one another by a liquid jet head. Viscosity (viscosity at 25° C.) of the imprint material is, for example, 1 mPa s or more and 100 mPa s or less.

In the present specification and the accompanying drawings, directions are defined in an XYZ coordinate system in which directions parallel to a front surface of the substrate form an XY plane. Directions parallel to an X-axis, a Y-axis, and a Z-axis in the XYZ coordinate system are respectively defined as an X direction, a Y direction, and a Z direction. Rotation about the X-axis, rotation about the Y-axis, and rotation about the Z-axis are respectively defined as $\theta X$, $\theta Y$, and $\theta Z$. Control or driving with respect to the X-axis, the Y-axis, and the Z-axis means control or driving with respect to the direction parallel to the X-axis, the direction parallel to the Y-axis, and the direction parallel to the Z-axis. Further, control or driving with respect to a $\theta X$-axis, a $\theta Y$-axis, and a $\theta Z$-axis means control or driving with respect to rotation about an axis parallel to the X-axis, rotation about an axis parallel to the Y-axis, and rotation about an axis parallel to the Z-axis. A position is information that may be specified based on coordinates on the X-axis, the Y-axis, and the Z-axis, and attitude is information that may be specified by values on the $\theta X$-axis, the $\theta Y$-axis, and the $\theta Z$-axis. Alignment means control of the position and/or the attitude. The alignment may include control of the position and/or the attitude of at least one of the substrate and the mold.

FIG. 1 is a schematic diagram illustrating a configuration of an imprint apparatus 100. The imprint apparatus 100 may include, for example, an imprint head 10 (mold holding mechanism) holding a mold M, a substrate stage 20 (substrate holding mechanism) movable while holding a substrate W, a supply unit 30, a curing unit 40, detection units 50, and a control unit CNT (calculation unit).

The mold M is normally made of a material that allows ultraviolet rays to pass therethrough, such as quartz, and a depression-protrusion pattern to be transferred to the imprint material on the substrate is provided in a partial area (pattern area) protruding toward the substrate side, of a surface on the substrate side. As the substrate W, glass, ceramics, a metal, a semiconductor, a resin, or the like is used, and a member made of a material different from the material of the substrate may be formed on the front surface of the substrate W as necessary. More specifically, the substrate W is a silicon wafer, a compound semiconductor wafer, quartz glass, or the like. Before application of the imprint material, an adhesive layer to improve adhesiveness between the imprint material and the substrate may be provided as necessary.

The imprint head 10 may include, for example, a mold holding unit 11 holding the mold M by vacuum force or the like, and a mold driving unit 12 driving the mold M (mold holding unit 11) in the Z direction so as to change the space between the mold M and the substrate W. The mold driving unit 12 may include a plurality of actuators. In the present exemplary embodiment, when the mold M is driven in the Z direction by the imprint head 10, a contact step of bringing the mold M and the imprint material on the substrate into contact with each other, and a demolding step of separating the mold M from the cured imprint material can be performed. Further, the imprint head 10 (mold driving unit 12) may include a function of driving the mold M in the XY directions and the $\theta$ direction (rotation direction about Z-axis) and a function of changing inclination (tilt) of the mold M, without being limited to the function of driving the mold M in the Z direction. In other words, the mold driving unit 12 may be configured to drive the mold M with respect to the plurality of axes (e.g., three axes of Z-axis, $\theta X$-axis, and $\theta Y$-axis, and desirably six axes of X-axis, Y-axis, Z-axis, $\theta X$-axis, $\theta Y$-axis, and $\theta Z$-axis).

The substrate stage 20 may include, for example, a substrate chuck 21 holding the substrate W by vacuum force or the like, and a substrate driving unit 22 driving the substrate W in the XY directions. The substrate driving unit 22 may include a plurality of actuators. In the present exemplary embodiment, when the substrate W is driven in the XY directions by the substrate stage 20, positioning of the substrate W relative to the mold M and positioning of the substrate W relative to the supply unit 30 can be performed. Further, the substrate stage 20 (substrate driving unit 22) may include a function of driving the substrate W in the Z direction and the $\theta$ direction and a function of changing inclination (tilt) of the substrate W, without being limited to the function of driving the substrate W in the XY directions. In other words, the substrate driving unit 22 may be configured to drive the substrate W with respect to the plurality of axes (e.g., three axes of X-axis, Y-axis, and $\theta Z$-axis, and desirably six axes of X-axis, Y-axis, Z-axis, $\theta X$-axis, $\theta Y$-axis, and $\theta Z$-axis).

In the imprint apparatus 100, the space between the mold M and the substrate W in the contact step and the demolding step may be changed by the imprint head 10 driving the mold M in the Z direction; however, the configuration is not limited thereto. For example, the space between the mold M and the substrate W may be changed by the substrate stage 20 driving the substrate W in the Z direction, or by both the imprint head 10 and the substrate stage 20 relatively driving the mold M and the substrate W in the Z direction. Further, in the imprint apparatus 100, alignment of the mold M and the substrate W in the XY directions may be performed by the substrate stage 20 driving the substrate W in the XY directions; however, the configuration is not limited thereto. For example, the alignment of the mold M and the substrate W in the XY directions may be performed by the imprint head 10 driving the mold M in the XY directions, or by both the imprint head 10 and the substrate stage 20 relatively driving the mold M and the substrate W in the XY directions.

The supply unit 30 (discharge unit or dispenser) supplies an imprint material R (e.g., uncured resin) to the substrate W. In the present exemplary embodiment, an ultraviolet curable resin having a property of being cured by irradiation with ultraviolet rays may be used as the imprint material R. In the imprint processing, in a state where the mold M and the imprint material R on the substrate are in contact with each other, the curing unit 40 (irradiation unit) cures the imprint material R by irradiating the imprint material R on the substrate W with light (e.g., ultraviolet rays) through the mold M.

The detection units 50 each include an alignment scope that detects an image (e.g., moire fringe or interference fringe) formed by a mold mark Mm provided in the mold M and a substrate mark Mw provided in the substrate W, and an image formed by a mold reference mark Mrm provided in the mold M. Further, the detection units 50 output a signal (a detection signal) corresponding to light intensity of the images. For example, the plurality of detection units 50 may be provided, and each of the detection units 50 is configured to be movable based on a position (XY directions) of a mark pair including the mold mark Mm and the substrate mark Mw and/or a position of the mold reference mark Mrm. As a result, the control unit CNT can determine a relative position (XY directions) of the mold mark Mm and the substrate mark Mw and the position of the mold reference mark Mrm based on the detection signal from each of the detection units 50 and can control the alignment of the mold M and the substrate W. The mold reference mark Mrm may be provided at a position detectable together with the mold mark Mm and the substrate mark Mw by each of the detection units 50. In other words, in the same field of view of each of the detection units 50, the mold reference mark Mrm and the moire fringe formed by the mold mark Mm and the substrate mark Mw are detected. Further, when each of the detection units 50 detects the mold mark Mm and the substrate mark Mw, a pattern may not be formed in a range of the substrate W corresponding to the position of the mold reference mark Mrm and a dimension (area) of the mold reference mark Mrm. A specific configuration of each of the detection units 50 is described below.

The control unit CNT includes, for example, a computer including a processing unit PRC represented by a central processing unit (CPU), and a memory MRY, and controls the imprint processing by controlling the units of the imprint apparatus 100. The imprint processing may include, for example, a supply step, the contact step, an alignment step, a curing step, and the demolding step.

The supply step is processing for supplying the imprint material R to the substrate by the supply unit 30 while driving the substrate W in the XY directions by the substrate driving unit 22 (substrate stage 20). The contact step is processing for bringing the mold M and the imprint material R on the substrate into contact with each other by the mold driving unit 12 (imprint head 10) driving the mold M to narrow the space between the mold M and the substrate W. The alignment step is processing for causing each of the detection units 50 to detect the image formed by the mold mark Mm and the substrate mark Mw and the image formed by the mold reference mark Mrm, and based on a detection result thereof, aligning the mold M and the substrate W (XY directions) by the mold driving unit 12 and the substrate driving unit 22. The curing step is processing for curing the imprint material R on the substrate by the curing unit 40 applying curing energy (e.g., by applying light) to the imprint material R. The demolding step is processing for separating the mold M from the cured imprint material R by the mold driving unit 12 driving the mold M to increase the space between the mold M and the substrate W.

The alignment step is not limited to processing for adjusting the relative position of a pattern area of the mold M and a shot area of the substrate W, and may include processing for deforming at least one of the mold M and the substrate W so as to reduce a shape difference between the pattern area and the shot area. In this case, the imprint apparatus 100 may be provided with a deformation mechanism (not illustrated) that deforms at least one of the mold M and the substrate W. The deformation mechanism may include, for example, a mold deformation mechanism that deforms the mold M by applying force to a side surface of the mold, and/or a substrate deformation mechanism that deforms the substrate W by heating the substrate W by light irradiation or the like.

Figure 2:
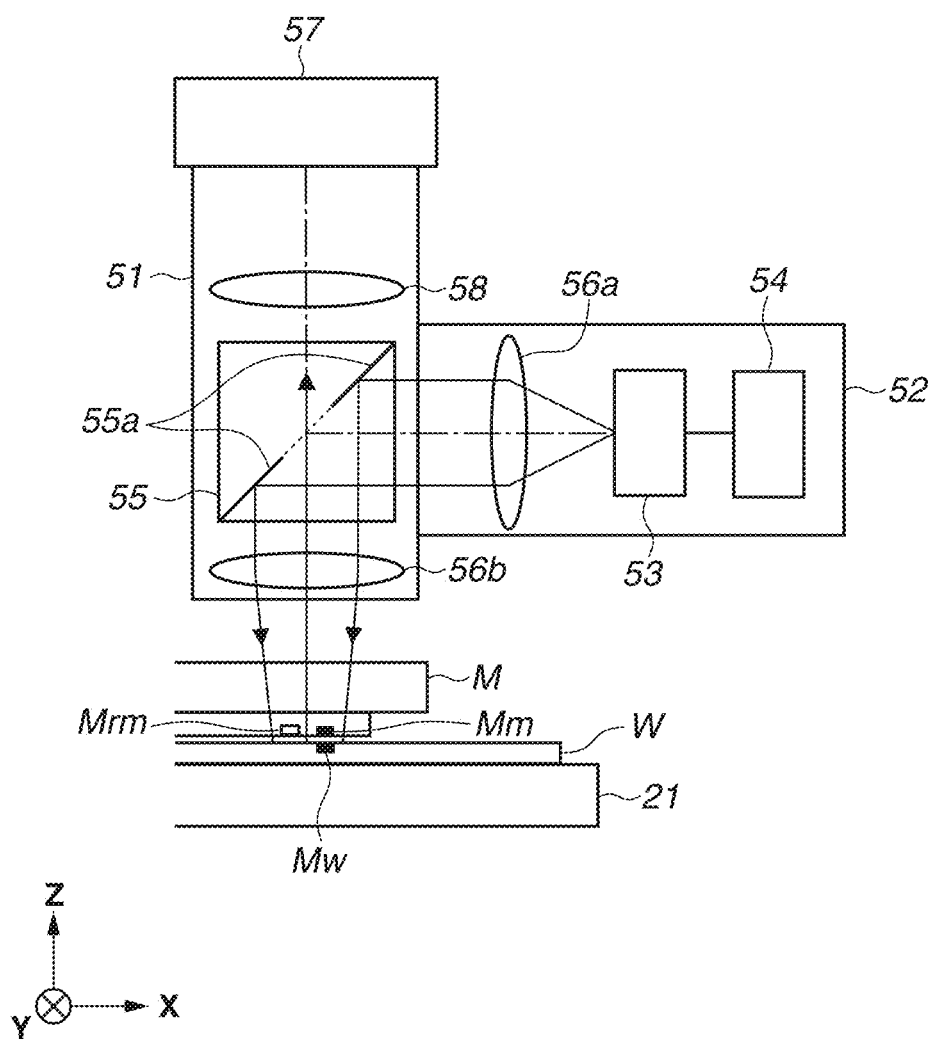
FIG. 2 is a diagram illustrating a configuration example of a detection unit.

Next, the specific configuration of each detection unit 50 is described. FIG. 2 is a diagram illustrating a configuration example of one detection unit 50. The detection unit 50 may include an imaging unit 51 that images the image formed by the mold mark Mm and the substrate mark Mw and/or the mold reference mark Mrm, and an illumination unit 52 that illuminates the mold mark Mm and the substrate mark Mw and/or the mold reference mark Mrm with illumination light.

The illumination unit 52 may include a light source unit 53, a driving circuit 54 that drives the light source unit 53, and an optical system 56a. The light source unit 53 may include, for example, at least one of a laser (e.g., semiconductor laser), a halogen lamp, a light-emitting diode (LED), a high-pressure mercury lamp, and a metal halide lamp, and desirably includes the laser. A wavelength of the illumination light generated from the light source unit 53 is desirably a wavelength not curing the imprint material R. The driving circuit 54 drives the light source unit 53 by supplying, for example, a driving signal including an alternate-current component to the light source unit 53.

The detection unit 50 may include a prism 55 and an optical system 56b as an optical system shared by the illumination unit 52 and the imaging unit 51. The illumination light from the light source unit 53 may illuminate an imaging field of view of the imaging unit 51 through the prism 55 and the optical system 56b. As a result, the mold mark Mm and the substrate mark Mw and/or the mold reference mark Mrm may be illuminated with the illumination light.

The imaging unit 51 may include an imaging element (image sensor) 57 and an optical system 58. Reflected light from the mold mark Mm and the substrate mark Mw and/or the mold reference mark Mrm illuminated by the illumination unit 52 may enter the imaging element 57 through the optical system 56b, the prism 55, and the optical system 58. The imaging element 57 captures an image formed on an imaging plane of the imaging element 57 by the mold mark Mm and the substrate mark Mw and/or the mold reference mark Mrm, and outputs a detection signal (or may output image data). A pupil plane of the illumination unit 52 and a pupil plane of the imaging unit 51 may be disposed on the same plane, and a reflection surface of the prism 55 may be disposed on the pupil plane or in a vicinity thereof.

As an example, each of the mold mark Mm and the substrate mark Mw includes a diffraction grating including a grating pattern. An image formed by diffracted light from the mold mark Mm and diffracted light from the substrate mark Mw illuminated with the illumination light, namely, a moire image (interference fringe or moire fringe) is formed on the imaging plane of the imaging element 57. A light quantity of the moire image depends on diffraction efficiency of the mold M and the substrate W (more specifically, the mold mark Mm and the substrate mark Mw). The diffraction efficiency periodically changes with the wavelength. Thus, there are a wavelength at which the moire image can be efficiently formed, and a wavelength at which the moire image is difficult to be formed. The light of the wavelength at which the moire image is difficult to be formed may become noise.

As an example, the prism 55 includes two optical members bonded to each other, and a reflection film 55a is disposed on a bonding surface. The reflection film 55a reflects light in a peripheral area of a pupil of the illumination unit 52. The reflection film 55a further includes an aperture functioning as an aperture stop that defines a size (or a detection numerical aperture NAo) of the pupil of the imaging unit 51. The prism 55 may be a half prism including a semi-transmission film on the bonding surface. Alternatively, in place of the prism 55, a plate-like optical element including a reflection film on a surface may be adopted. In place of the configuration illustrated in FIG. 2, the reflection film 55a may be configured to reflect light in a center area of the pupil of the illumination unit 52 and to allow light in the peripheral area to pass therethrough, and positions of the illumination unit 52 and the imaging unit 51 may be interchanged.

Figure 3:
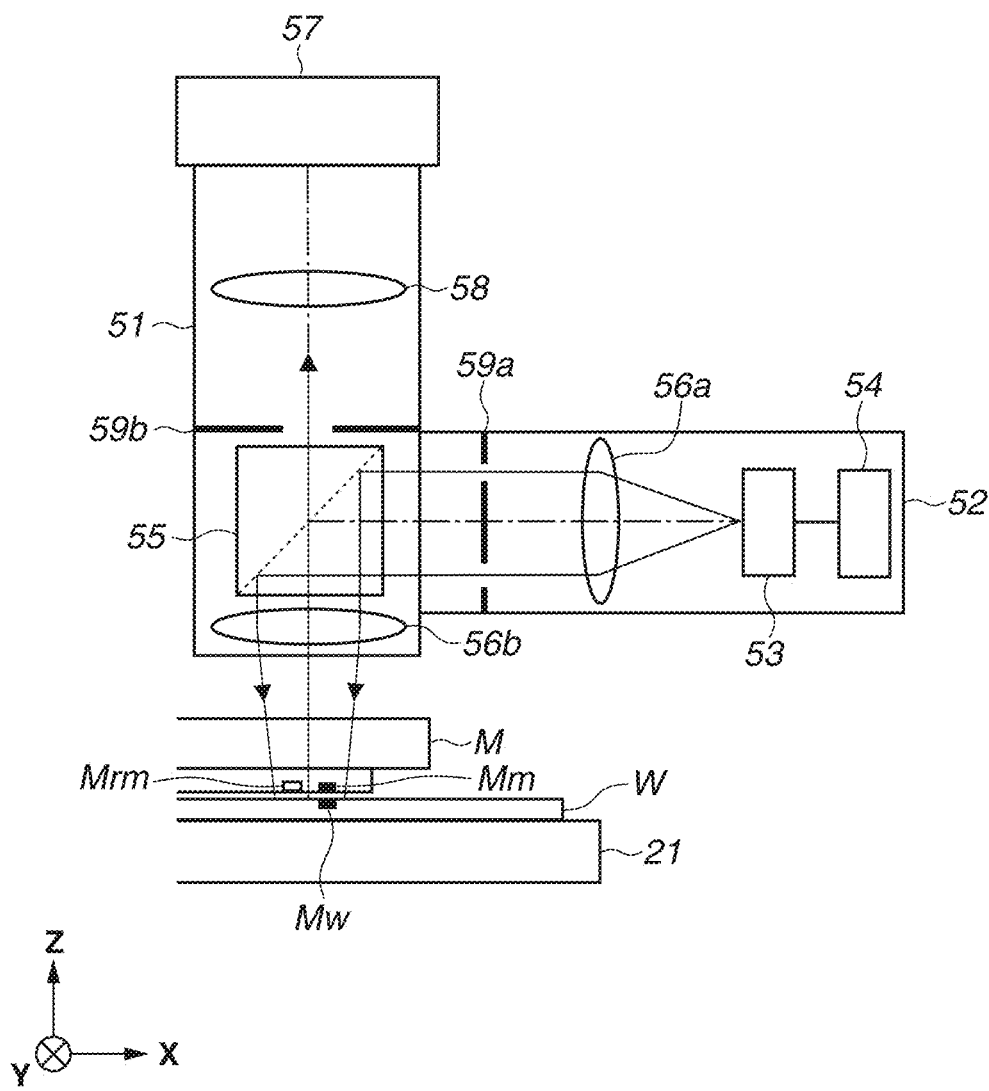
FIG. 3 is a diagram illustrating a modification of the detection unit.

FIG. 3 is a diagram illustrating a modification of the detection unit 50. In the modification illustrated in FIG. 3, the pupil of the illumination unit 52 is disposed at a position separated from the reflection surface of the prism 55, and a diaphragm 59a is disposed on the pupil plane of the illumination unit 52. Further, the pupil of the imaging unit 51 is disposed at a position separated from the reflection surface of the prism 55, and a diaphragm 59b is disposed on the pupil plane of the imaging unit 51. The prism 55 may be a half prism including two optical members bonded together and a semi-transmission film on the bonding surface.

Figure 4:
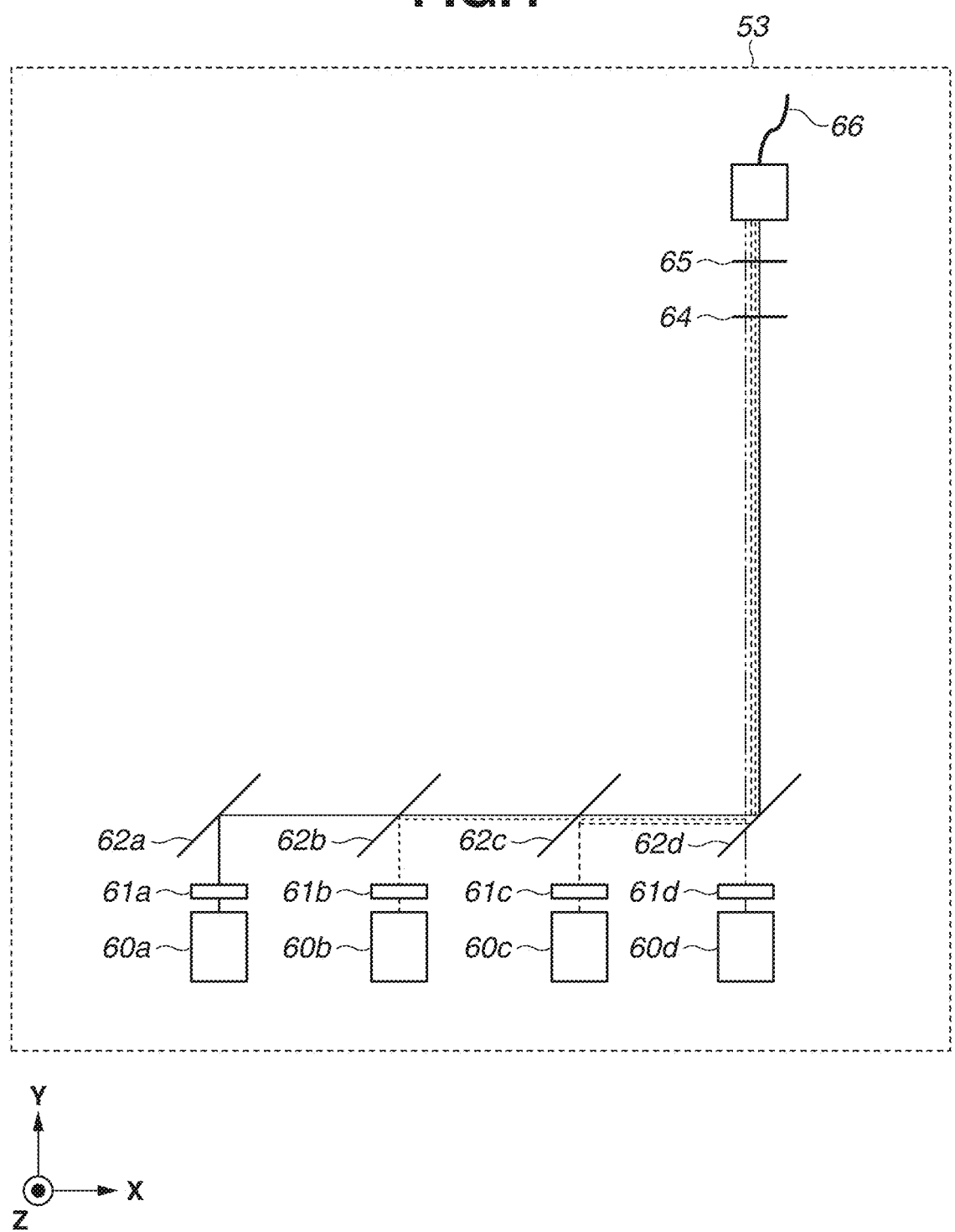
FIG. 4 is a diagram illustrating a configuration example of a light source unit.

FIG. 4 is a diagram illustrating a detailed configuration example of the light source unit 53. The light source unit 53 may include a plurality of light sources 60a to 60d. Each of the plurality of light sources 60a to 60d may include a laser (e.g., semiconductor laser). However, each of the plurality of light sources 60a to 60d may include at least two types of light source selected from a plurality of types of light source such as a laser, a halogen lamp, an LED, a high-pressure mercury lamp, and a metal halide lamp. The driving circuit 54 may include a plurality of driving elements that drive the respective light sources 60a to 60d.

The light source unit 53 may include a plurality of optical systems 61a to 61d corresponding to the respective light sources 60a to 60d. Each of the plurality of optical systems 61a to 61d may include, for example, one or a plurality of lenses. Light beams emitted from the plurality of light sources 60a to 60d pass through the plurality of optical systems 61a to 61d, and are then combined by a plurality of optical elements 62a to 62d. As an example, the optical element 62a is a mirror, and each of the optical elements 62b to 62d is a dichroic mirror or a half mirror. In a case where wavelength bands of the light beams generated from the light sources 60a to 60d are different by, for example, about 50 nm or more from one another, the light beams can be combined by use of dichroic mirrors. In a case where the wavelengths of the light beams emitted from the light sources 60a to 60d are equal to or close to each other and the light beams cannot be efficiently combined by the dichroic mirrors, the light beams can be combined by use of half mirrors. In the configuration illustrated in FIG. 4, the light beams from the plurality of light sources 60a to 60d are combined one by one; however, for example, the light beams from the plurality of light sources 60a to 60d may be combined two by two to generate a plurality of combined light beams, and then the plurality of combined light beams may be combined one by one.

The light beam combined by the plurality of optical elements 62a to 62d may be adjusted in intensity by a neutral density (ND) filter 64. The ND filter 64 is an element that can adjust intensity of a light beam to be passed, and a transmittance of the ND filter 64 may be determined based on, for example, a type and a thickness of metal film provided on quartz. A plurality of ND filters 64 different in transmittance from one another may be provided, and one ND filter 64 selected from the plurality of ND filters 64 may be disposed in an optical path to adjust the transmittance. Alternatively, one ND filter 64 may be configured to have different transmittances depending on a passing position of the light beam, and the passing position of the light beam may be changed based on a target light intensity. The intensity of the light beam emitted from the light source unit 53 may be adjusted by adjustment of driving currents for the plurality of light sources 60a to 60d, in place of change by the ND filter 64. Alternatively, the intensity of the light beam emitted from the light source unit 53 may be adjusted by a combination of the change by the ND filter 64 and the adjustment of the driving currents for the plurality of light sources 60a to 60d.

The light beam having passed through the ND filter 64 may be supplied to a fiber 66 after passing through a diffuser plate 65. A light beam emitted from a laser, such as a semiconductor laser, has a narrow wavelength band of several nanometers, and the laser may be a light source that emits a coherent light beam aligned in vector. Thus, noise (speckle noise) may occur in an observed image due to interference. The diffuser plate 65 is rotated to temporally change a state of a waveform, which reduces the observed speckle noise. The light beam emitted from the fiber 66 is the light beam emitted from the light source unit 53.

Figure 5:
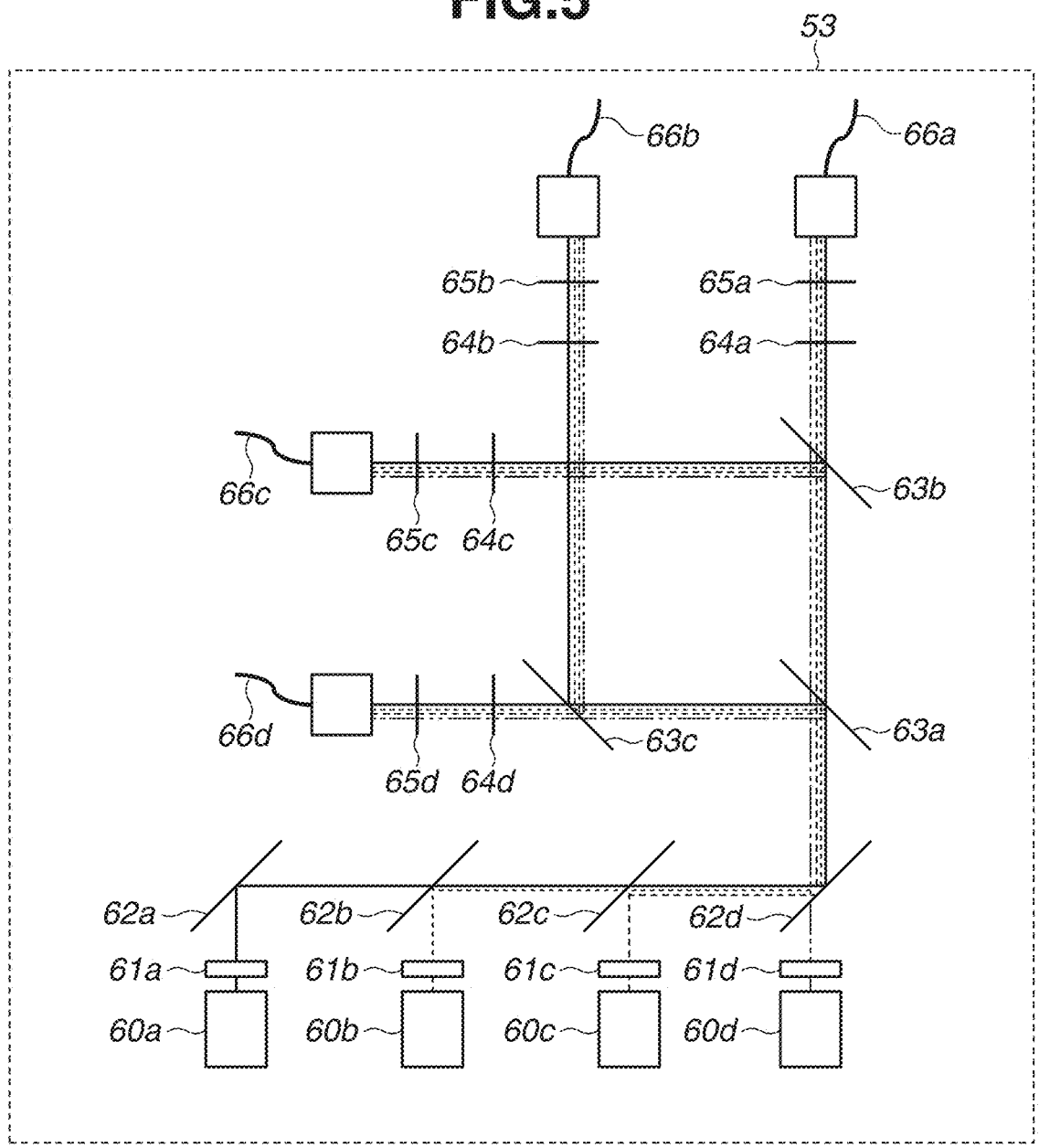
FIG. 5 is a diagram illustrating a modification of the light source unit.

In the example illustrated in FIG. 4, the light beam is emitted from only one fiber 66. In place of such an example, as illustrated in FIG. 5, half mirrors 63a to 63c may be disposed in the optical path to split the light beam, and a plurality of light beams may be emitted via a plurality of fibers 66a to 66d. In this case, the ND filter 64 and the diffuser plate 65 may be provided to each of the plurality of fibers 66a to 66d. More specifically, as illustrated in FIG. 5, a plurality of ND filters 64a to 64d and a plurality of diffuser plates 65a to 65d may be provided.

Figure 6:
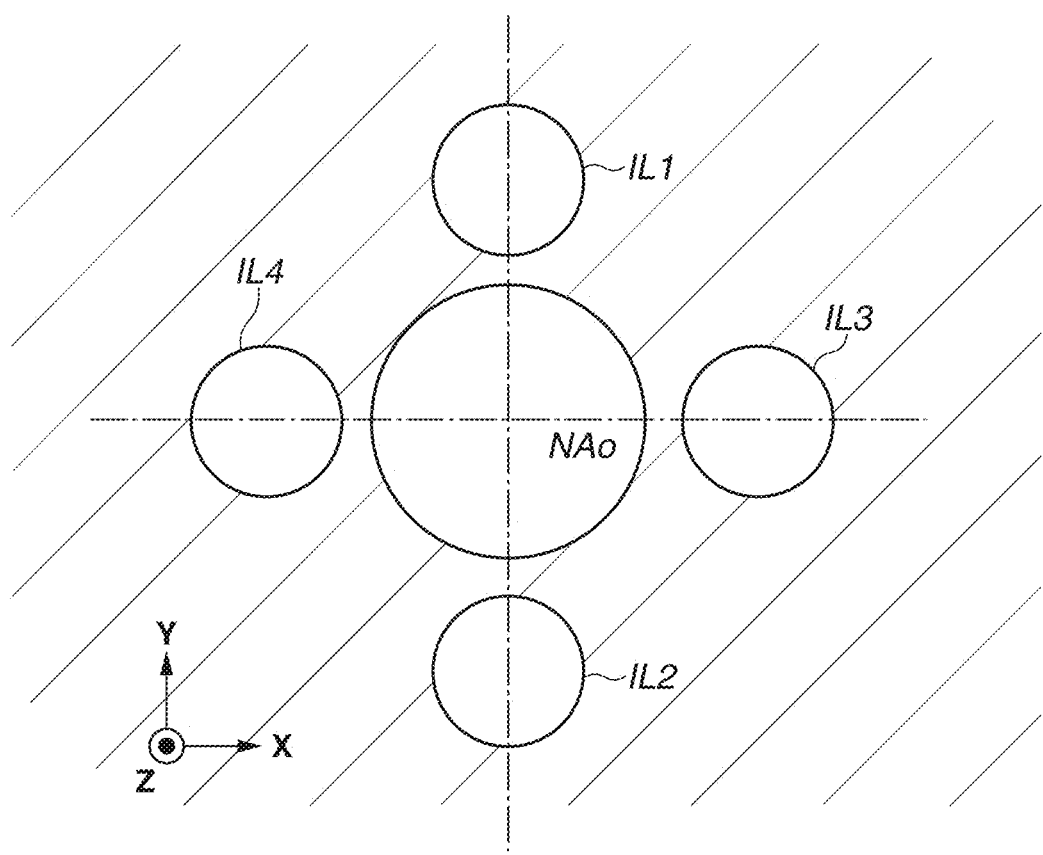
FIG. 6 is a diagram illustrating an example of a positional relationship between pupil intensity distribution of an illumination unit of the detection unit and a numerical aperture of an imaging unit.

FIG. 6 is a diagram illustrating an example of a positional relationship between pupil intensity distribution (IL1 to IL4) of the illumination unit 52 of the detection unit 50 and the numerical aperture NAo of the imaging unit 51. In the example illustrated in FIG. 6, the pupil intensity distribution of the illumination unit 52 includes a first pole IL1, a second pole IL2, a third pole IL3, and a fourth pole IL4. The configuration makes it possible to illuminate the mold mark Mm and the substrate mark Mw with light from the first pole IL1 and the second pole IL2 in the ±Y direction and with light from the third pole IL3 and the fourth pole IL4 in the ±X direction. When the reflection film 55a functioning as an aperture stop is disposed on the pupil plane of the illumination unit 52 as illustrated in FIG. 2 or when the diaphragm 59a is disposed on the pupil plane of the illumination unit 52 as illustrated in FIG. 3, the plurality of poles (first pole IL1 to fourth pole IL4) can be formed from one light source unit 53. In the case where the pupil intensity distribution having the plurality of poles (peaks) as described above is formed, a plurality of light source units is unnecessary. Therefore, the detection unit 50 can be simplified or downsized.

Figure 7A:
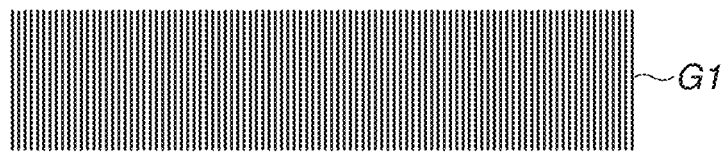
FIGS. 7A to 7D are diagrams each illustrating a configuration example of a diffraction grating and a moire image.
Figure 7B:
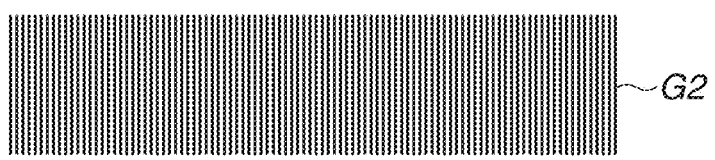

Next, a generation principle of the moire image formed by the mold mark Mm and the substrate mark Mw, and a method of determining the relative position of the mold mark Mm and the substrate mark Mw by use of the moire image are described. FIGS. 7A and 7B are diagrams respectively illustrating configuration examples of diffraction gratings G1 and G2 that are slightly different in period (grating pitch) of a grating pattern from each other. The diffraction grating G1 is used for, for example, the mold mark Mm, and has a grating pattern in which a plurality of line elements extending in the Y direction is arranged in the X direction with a first grating pitch. The diffraction grating G2 is used for, for example, the substrate mark Mw, and has a grating pattern in which a plurality of line elements extending in the Y direction is arranged in the X direction with a second grating pitch different from the first grating pitch.

Figure 7C:
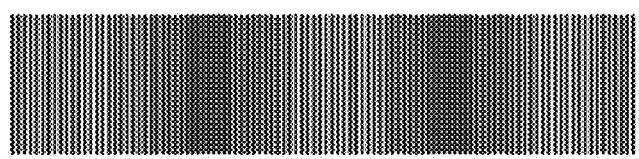
Figure 7D:
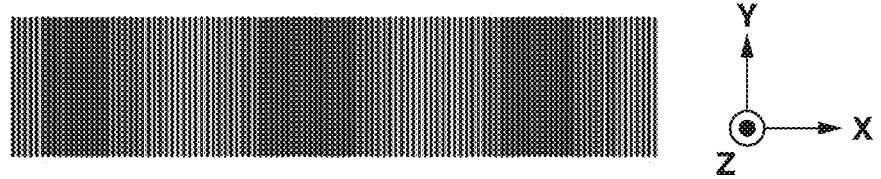

When the diffraction gratings G1 and G2 are overlaid on each other, a pattern (moire image) having a period reflecting a period difference between the diffraction gratings G1 and G2 is generated as illustrated in FIG. 7C due to interference of diffracted light from the two diffraction gratings. A phase of the moire image (positions of bright and dark portions) is changed depending on the relative position of the diffraction gratings. For example, when the relative position of the diffraction gratings G1 and G2 is slightly shifted in the X direction, the moire image illustrated in FIG. 7C is changed to a moire image illustrated in FIG. 7D. The phase of the moire image is changed with a value greater than periods of actual changes in relative position of the two diffraction gratings. Thus, even when resolution of the detection unit 50 (imaging unit 51) is low, the relative positional shift of the two diffraction gratings can be enlarged and detected.

Figure 8A:
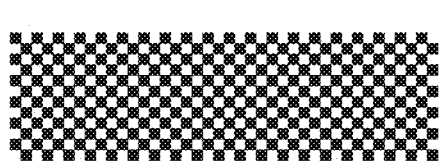
FIGS. 8A to 8D are diagrams illustrating configuration examples of a diffraction grating of a mold mark and a substrate mark.
Figure 8B:
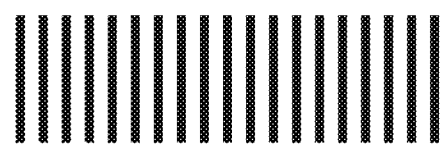

A case where the diffraction gratings G1 and G2 are detected in a bright field in order to detect the moire image (the diffraction gratings G1 and G2 are illuminated in a perpendicular direction, and diffracted light diffracted by the diffraction gratings G1 and G2 in the perpendicular direction is detected) is described. In this case, the detection unit 50 (imaging unit 51) also detects 0th-order light from the diffraction gratings G1 and G2. The 0th-order light may be a factor that deteriorates contrast of the moire image. Thus, the detection unit 50 desirably has a configuration that does not detect the 0th-order light (i.e., illuminates the diffraction gratings G1 and G2 with obliquely incident light), namely, a configuration that detects the diffraction gratings G1 and G2 in a dark field. To enable detection of the moire image in the dark field, one of the diffraction gratings G1 and G2 is desirably configured as a diffraction grating having a checkerboard pattern as illustrated in FIG. 8A, and the other is desirably configured as a diffraction grating as illustrated in FIG. 8B. The diffraction grating illustrated in FIG. 8A includes a pattern periodically arranged in a measurement direction (X direction) and a pattern periodically arranged in a direction (Y direction) orthogonal to the measurement direction.

With reference to FIG. 6 and FIGS. 8A and 8B, the light from the first pole IL1 and the second pole IL2 is applied to the diffraction gratings and is diffracted in the Y direction and also in the X direction by the diffraction grating having the checkerboard pattern. Further, the light diffracted in the X direction by the diffraction grating slightly different in period has relative positional information in the X direction and enters the detection area (the numerical aperture NAo) on the pupil of the imaging unit 51, and is detected (imaged) by the imaging element 57.

In a relationship between the pupil intensity distribution illustrated in FIG. 6 and the diffraction gratings illustrated in FIGS. 8A and 8B, light from the third pole IL3 and the fourth pole IL4 is not used to detect the relative position of the diffraction gratings.

Figure 8C:
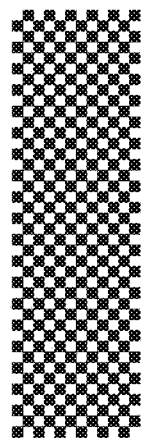
Figure 8D:

However, to detect the relative position of the diffraction gratings illustrated in FIGS. 8C and 8D, the light from the third pole IL3 and the fourth pole IL4 is used to detect the relative position of the diffraction grating while the light from the first pole IL1 and the second pole 112 is not used to detect the relative position of the diffraction gratings. In a case where a pair of diffraction gratings illustrated in FIGS. 8A and 8B and a pair of diffraction gratings illustrated in FIGS. 8C and 8C are arranged in the same field of view of the imaging unit 51 and relative positions in two directions are simultaneously detected, the pupil intensity distribution illustrated in FIG. 6 is useful.

Figure 9A:
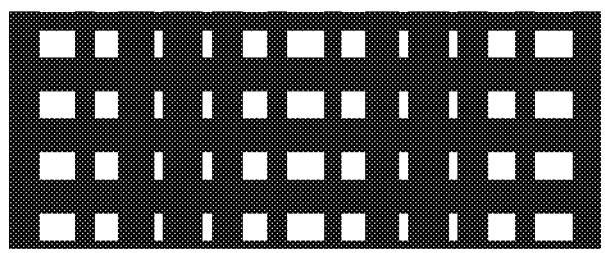
FIGS. 9A and 9B are diagrams each illustrating a configuration example of a reference mark and an image of the reference mark.
Figure 10A:
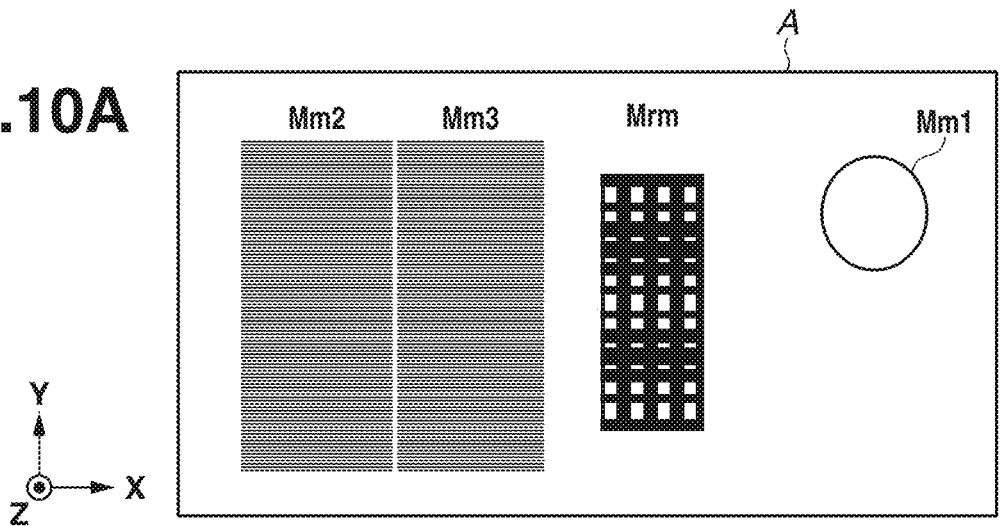
FIGS. 10A to 10C are diagrams illustrating configuration examples of marks according to a first exemplary embodiment.
Figure 10B:
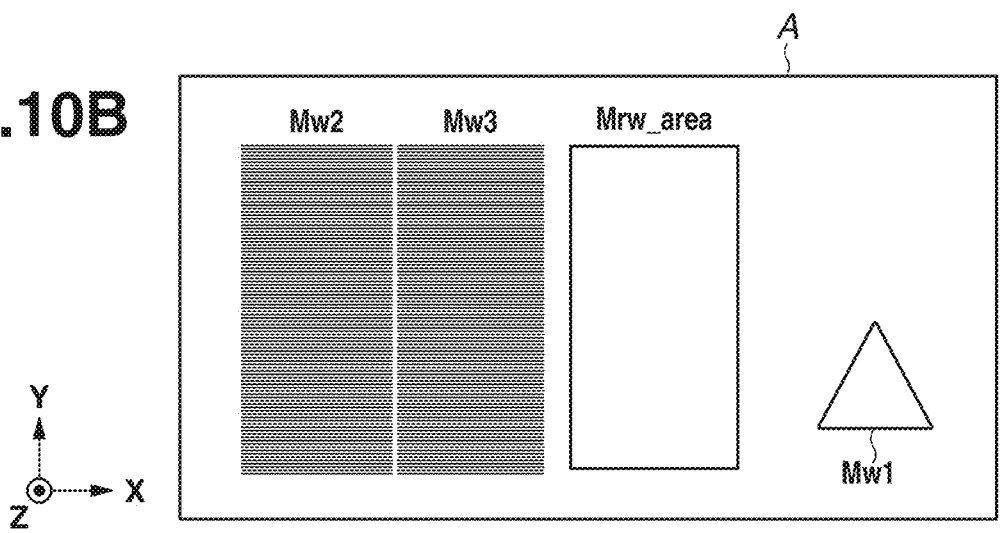
Figure 10C:
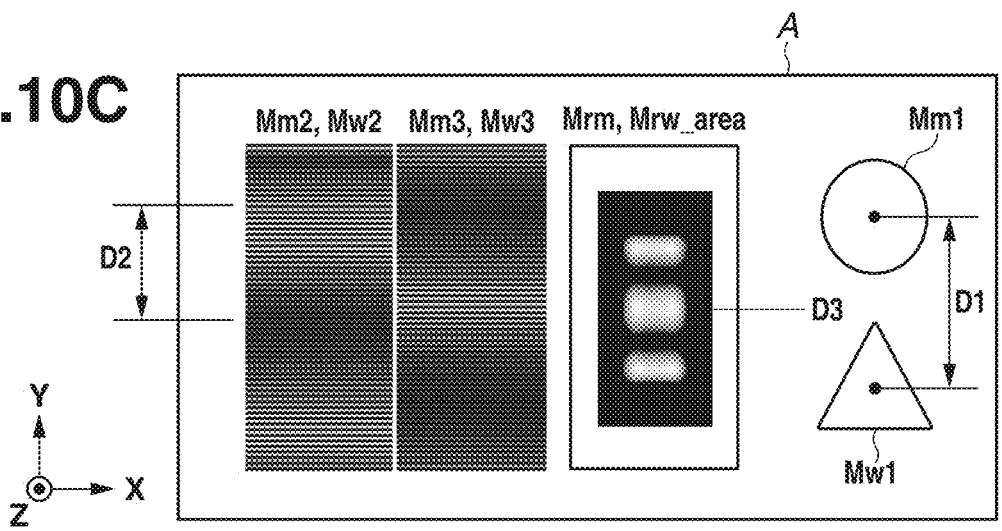

FIGS. 10A to 10C are diagrams illustrating configuration examples of the mold mark Mm and the substrate mark Mw. An outer frame A in FIGS. 10A to 10C is the imaging field of view of each detection unit 50 (imaging unit 51), and the detection unit 50 can detect (observe) a range within the outer frame A at a time. For example, the mold mark Mm in FIG. 10A may include, as mark elements, a rough detection mark Mm1 having any shape, precise detection marks Mm2 and Mm3 each including a diffraction grating, and the mold reference mark Mrm. The mold reference mark Mrm may include, as a mark element, a pattern as illustrated in FIG. 9A. The substrate mark Mw in FIG. 10B may include, as mark elements, a rough detection mark Mw1 having any shape, precise detection marks Mw2 and Mw3 each including a diffraction grating, and a substrate reference mark area Mrw_area. The substrate reference mark area Mrw_area indicates an area where a pattern is not to be formed in a range of the substrate W corresponding to the position of the mold reference mark Mrm and the dimension of the mold reference mark Mrm when the mold mark Mm and the substrate mark Mw are detected. FIG. 10C illustrates a state where the mold M and the substrate W are brought close to each other and the positions of the mold mark Mm and the substrate mark Mw are measured. A rough relative position D1 of the mold mark Mm and the substrate mark Mw can be determined based on a geometric center position of the rough detection mark Mm1 of the mold mark Mm and a geometric center position of the rough detection mark Mw1 of the substrate mark Mw. The rough detection marks Mm1 and Mw1 can be downsized. This enables rough alignment by use of the marks that occupy small areas. An intensity ratio may occur between captured mark images due to difference between a reflectance of the rough detection mark Mm1 and a reflectance of the rough detection mark Mw1. In the case of a large intensity ratio, when intensity of illumination light is adjusted so that the mark image having a weak intensity has a proper intensity, the mark image having a strong intensity is saturated, and a measurement error may occur. Therefore, the intensity ratio between the two mark images is to be suppressed.

Next, a moire image (moire image on the left side) formed by the precise detection mark Mm2 of the mold mark Mm and the precise detection mark Mw2 of the substrate mark Mw is described. The precise detection marks Mm2 and Mw2 each include a periodic grating pattern as illustrated in FIGS. 8C and 8D. When the precise detection marks Mm2 and Mw2 are overlaid on each other, a moire image is formed in the Y direction since the periods (grating pitches) in the measurement direction (Y direction) are slightly different from each other. Further, a shift direction of the moire image when the relative position of the marks is changed is different depending on a difference between the period of the precise detection mark Mm2 and the period of the precise detection mark Mw2. For example, in a case where the period of the precise detection mark Mm2 of the mold mark Mm is slightly greater than the period of the precise detection mark Mw2 of the substrate mark Mw, if the substrate W is shifted in the +Y direction relative to the mold M, the moire image (positions of bright and dark portions) is shifted in the +Y direction. In contrast, in a case where the period of the precise detection mark Mm2 of the mold mark Mm is slightly less than the period of the precise detection mark Mw2 of the substrate mark Mw, if the substrate W is shifted in the +Y direction relative to the mold M, the moire image (positions of bright and dark portions) is shifted in the −Y direction.

Next, a moire image (moire image on the right side) formed by the precise detection mark Mm3 of the mold mark Mm and the precise detection mark Mw3 of the substrate mark Mw is described. The precise detection marks Mm3 and Mw3 are obtained as a result of interchanging the periods in the measurement direction of the precise detection marks Mm2 and Mw2. Thus, when the relative position of the mold M and the substrate W is changed, the positions of the bright and dark portions in the moire image on the left side and the positions of the bright and dark portions in the moire image on the right side are changed in directions opposite to each other. The two moire images configured as described above are used so that it is possible to accurately determine the relative position of the mold mark Mm and the substrate mark Mw (the relative position of the mold M and the substrate W) from a relative positional shift D2 (e.g., a difference of positions of dark portions) of the two moire images.

At this time, even if relative positions of the precise detection marks Mm2 and Mm3 of the mold mark Mm and the precise detection marks Mw2 and Mw3 of the substrate mark Mw are shifted by a period of the moire image, the shift by the period cannot be recognized (detected) from the precise detection marks. Thus, in the example illustrated in FIG. 10C, the rough detection marks Mm1 and Mw1 that enable determination of the relative position of the mold M and the substrate W with accuracy lower than accuracy by the precise detection marks are used. When the rough detection marks Mm1 and Mw1 are used, it is possible to specify the positions of the precise detection marks and to check the positional shift by the period of the moire image formed by the precise detection marks. The precise detection marks and the rough detection marks are described on a conceptual basis. For example, in a case where the relative position of the mold mark Mm and the substrate mark Mw is represented by a two-digit value, a tens place may be determined based on a detection result of the rough detection marks, and a ones place may be determined based on a detection result of the precise detection marks.

Figure 9B:
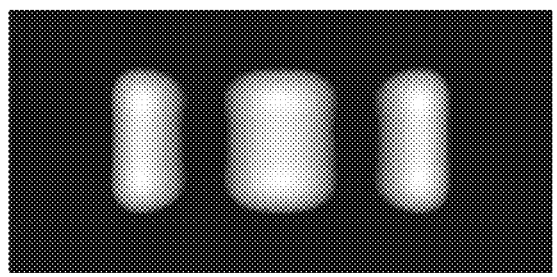

Next, a detail of the mold reference mark Mrm is described. As illustrated in FIG. 9A, the mold reference mark Mrm is formed by presence/absence of a chromium film on a glass surface. For example, the chromium film is provided in a void area, and the mold reference mark Mrm has a pattern of a plurality of lines. The plurality of lines of the pattern is arranged in the measurement direction (X direction). A width of each line and a space (pitch) between the lines in the measurement direction of the linear pattern are determined by sinusoidally changing a duty ratio of the line width and the pitch so as to be less than or equal to the resolution of the imaging unit 51 of the detection unit 50. In this example, the pitch of the linear pattern is set to be constant, and the line width is sinusoidally changed. This sinusoidally changes a ratio of the line width to the pitch of the linear pattern. FIG. 9B illustrates an image of the mold reference mark Mrm captured by the imaging element 57 of the detection unit 50. Since the mold reference mark Mrm is a pattern at resolution less than or equal to the resolution of the imaging unit 51 of each detection unit 50, the lines of the pattern are not resolved as illustrated in FIG. 9B, and the image of the mold reference mark Mrm captured by the imaging element 57 is blurred. The image captured by the imaging element 57 is an image having brightness and darkness changed corresponding to the change in the sinusoidally-changed duty ratio of the line width and the pitch, and is a sine-wave signal similar to the moire fringe.

The control unit CNT can determine the period of the sine-wave signal (detection signal) by using the image of the mold reference mark Mrm captured by the imaging element 57. The period of the sine-wave signal of the mold reference mark Mrm imaged by the imaging element 57 is determined from the period of the sinusoidally-changed duty ratio of the line width and the pitch of the mold reference mark Mrm. Accordingly, the control unit CNT can evaluate an optical magnification that is one of optical performances of the detection unit 50 from the period of the sine-wave signal of the mold reference mark Mrm actually formed on the imaging element 57. In this example, in particular, the magnification of the imaging unit 51 (image-forming optical system) of the detection unit 50 can be evaluated. In addition, when the sine-wave signal of the mold reference mark Mrm is imaged by the imaging element 57 a plurality of times, reproducibility of measurement that is one of the optical performances of the detection unit 50 can be evaluated from variation of a phase of the sine-wave signal. In the above-described manner, the detection unit 50 detects the above-described mold reference mark Mrm, which makes it possible to evaluate the optical performances of the detection unit 50 by use of only the mold M without the use of both the mold M and the substrate W. Thus, the mold reference mark Mrm is an evaluation mark for evaluation of the optical performances of the detection unit 50.

Next, the step of aligning the mold M and the substrate W is described. For example, the control unit CNT causes the detection unit 50 to detect the moire image formed by the mold mark Mm (precise detection mark) and the substrate mark Mw (precise detection mark), and determines the relative position of the mold mark Mm and the substrate mark Mw based on a detection result (detection signal obtained from the detection unit 50). As a result, the control unit CNT can control the alignment of the mold M and the substrate W based on the determined relative position.

However, even in a case where the moire image formed by the mold mark Mm and the substrate mark Mw is detected by the detection unit 50 and the relative position of the mold and the substrate is controlled to a target value, the relative position may not be coincident with the target value in inspection of the substrate by an overlay inspection apparatus after imprinting. In other words, a difference may occur between a result obtained by detection of the moire fringe and control of the relative position and a result of the inspection of the substrate by the overlay inspection apparatus after imprinting. This is caused by, for example, the imprint apparatus, a manufacturing process, and the like. Examples of the factor include characteristics of the optical element of the detection unit 50, illuminance unevenness of the light source unit 53, noise of the imaging element 57, and unnecessary light that has been emitted from the light source unit 53 and reflected by a circuit pattern around the mark or the mark. The mark contrast (brightness and darkness of an image) to calculate positional information on the mark is changed by these factors, a mark position is erroneously detected by the detection unit 50, and the mold M and the substrate W are positioned at wrong positions based on the mark position. A recurring component among components causing detection of the erroneous mark position is desirably calibrated. Thus, information (calibration information) indicating a relationship between the change of the relative position of the mold mark Mm and the substrate mark Mw and the change of the detection result of the moire image by the detection unit 50 is desirably determined in advance, and the alignment of the mold M and the substrate W is desirably performed based on the calibration information. In contrast, a non-recurring component is irregularly generated and is not removable. Therefore, the non-recurring component is generated as an overlay error.

Thus, the imprint apparatus 100 according to the present exemplary embodiment acquires the calibration information by using the mold reference mark Mrm provided in the mold M, and performs excellent alignment of the mold M and the substrate W. As an example, a state where the mold M and the substrate W are brought close to each other and the positions of the mold mark Mm and the substrate mark Mw are measured in imprinting as illustrated in FIG. 10C is described. The rough relative position D1 of the mold mark Mm and the substrate mark Mw can be determined based on the geometric center position of the rough detection mark Mm1 of the mold mark Mm and the geometric center position of the rough detection mark Mw1 of the substrate mark Mw. Further, the relative position of the mold mark Mm and the substrate mark Mw can be accurately determined from the relative positional shift D2 (e.g., a difference of positions of dark portions) between the moire image formed by the precise detection mark Mm2 and the precise detection mark Mw2 and the moire image formed by the precise detection mark Mm3 and the precise detection mark Mw3.

At a timing similar to that of detection of the rough detection marks and the moire fringe, the mold reference mark Mrm is detected by the imaging unit 51 of the detection unit 50, and the detection is performed continuously or at any timing. Since the mold reference mark Mrm is essentially formed by presence/absence of the chromium film on the glass surface, the same value is to be detected at any timing; however, the detected value may be varied due to the imprint apparatus, the manufacturing process, and the like as described above. Thus, when the mold M and the substrate W are brought close to each other and the mold mark Mm and the substrate mark Mw are detected in imprinting, the detection result of the mold reference mark Mrm is acquired and stored. Then, the detection result based on detection of the moire image formed by the precise detection mark Mm2 and the precise detection mark Mw2 and the moire image formed by the precise detection mark Mm3 and the precise detection mark Mw3 is corrected by the detection result of the mold reference mark Mrm. The detection result based on the detection of the moire image includes a detection result of the moire image, or the relative position of the mold mark and the substrate mark (relative position of mold and substrate) determined from the detection result of the moire image.

In the step of aligning the mold M and the substrate W in imprinting, a control process in which the mold mark Mm and the substrate mark Mw are detected and positioned to the target values is repeated a plurality of times during a period in which the mold M and the substrate W are brought close to each other and the imprint material is exposed and cured. Thus, detection of the mold reference mark Mrm is performed a plurality of times, and the detection result based on the moire image is corrected by use of the detection result of the mold reference mark Mrm, which enables continuous positional correction. For example, the detection result based on the moire image at each detection timing is corrected by use of a detection result Rn (n=2, 3, 4, . . . ) of the mold reference mark Mrm after a first detection result R1 of the mold reference mark Mrm.

Further, when a temporal frequency of the detection of the mold reference mark Mrm is increased, deviation from the target value in the positional correction can be suppressed. As a result, trackability in the control is improved. This makes it possible to remove, for example, a component that may change the mark contrast overlapped on the mold reference mark Mrm and the moire image in common, and to obtain an excellent detection result with reduced influence.

Further, the mold mark Mm including the mold reference mark Mrm and the substrate mark Mw are provided within a detection range of the imaging element 57, which makes it possible to detect these marks at the same time without moving of the detection unit 50. Further, when the mold mark Mm and the substrate mark Mw are detected, no pattern is present in the substrate reference mark area Mrw_area of the substrate W corresponding to the position of the mold reference mark Mrm and the dimension of the mold reference mark Mrm. This makes it possible to reduce unnecessary light from a base of the substrate W and/or a peripheral circuit pattern at the time of detection of the mold reference mark Mrm.

Figure 11:
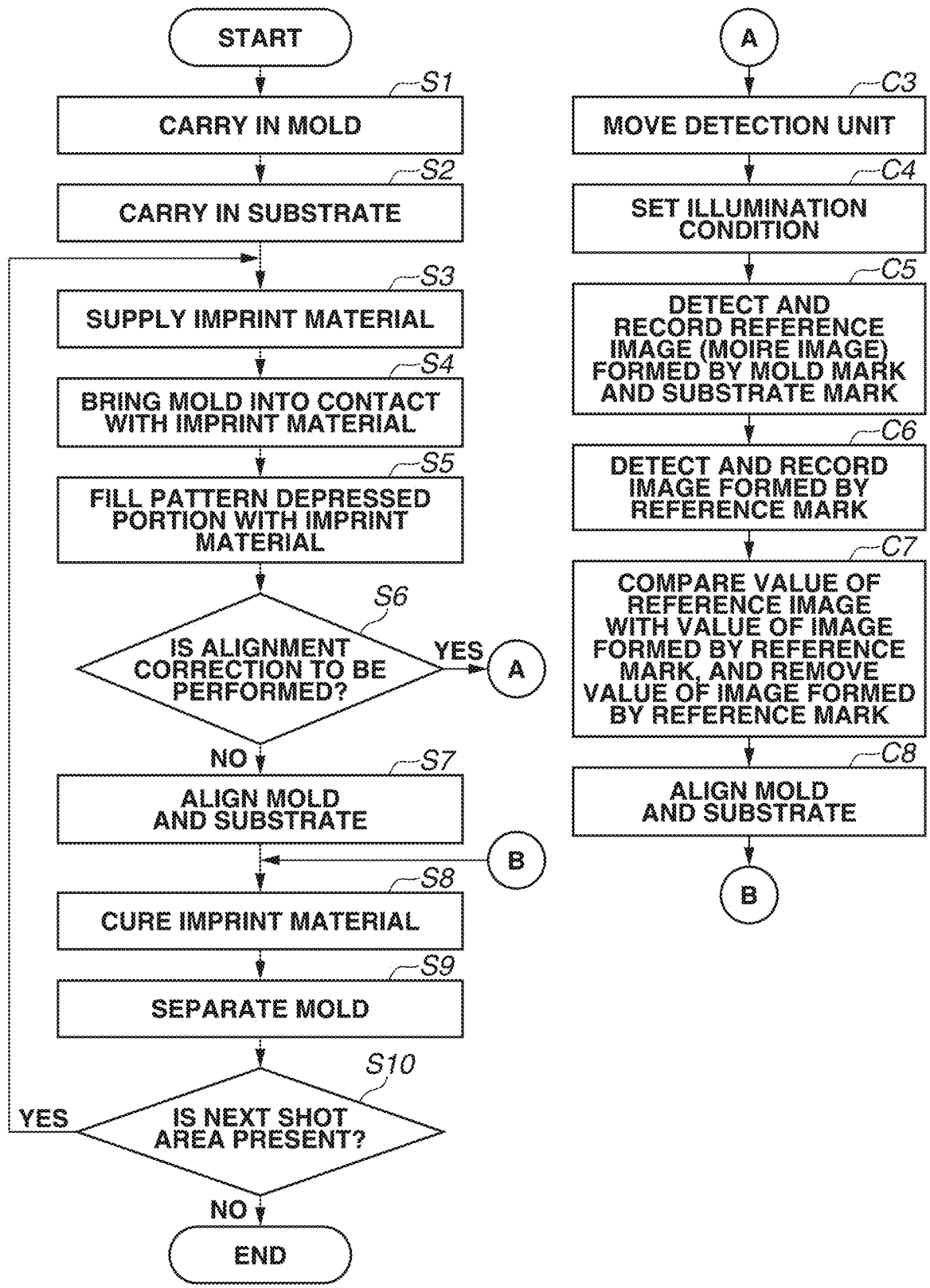
FIG. 11 is a flowchart illustrating imprint processing.

Next, the imprint processing according to the present exemplary embodiment is described. FIG. 11 is a flowchart illustrating the imprint processing according to the present exemplary embodiment. Each step in the flowchart illustrated in FIG. 11 may be controlled by the control unit CNT.

First, the imprint processing is described with reference to FIG. 11. In step S1, the control unit CNT controls a mold conveyance mechanism, and the mold conveyance mechanism carries the mold M in the imprint head 10 (mold carry-in step). In step S2, the control unit CNT controls a substrate conveyance mechanism, and the substrate conveyance mechanism carries the substrate W in the substrate stage 20 (substrate carry-in step). In step S3, the control unit CNT causes the supply unit 30 to discharge the imprint material R while moving the substrate stage 20 holding the substrate W relative to the supply unit 30, thereby supplying the imprint material R to a target shot area of the substrate W (supply step). In step S4, the control unit CNT moves the substrate stage 20 so that the target shot area is disposed below the mold M, and narrows the space between the mold M and the substrate W by the imprint head 10 to bring the mold M and the imprint material on the substrate into contact with each other (contact step). In step S5, filling of a pattern depressed portion of the mold M with the imprint material is started (filling step). In step S6, the control unit CNT determines whether to perform an alignment correction of the mold M and the substrate W by use of the mold reference mark Mrm. For example, the control unit CNT may determine to perform the alignment correction in a case where the alignment of the mold M and the substrate W is managed with high precision, in a case where a condition of the manufacturing process is changed, in a case where a lot is changed, in a case where a type of the mold M is changed, or in a case where a predetermined time has elapsed from the previous alignment correction. In a case where the control unit CNT determines not to perform the alignment correction (NO in step S6), the processing proceeds to step S7. In a case where the control unit CNT determines to perform the alignment correction (YES in step S6), the processing proceeds to step C3. The case where the processing proceeds to step C3 is described below.

In step S7, the control unit CNT causes the detection unit 50 to detect the image formed by the mold mark Mm and the substrate mark Mw, and controls the alignment of the mold M and the substrate W based on a detection result (alignment step). For example, the control unit CNT determines the relative position (XY directions) of the mold mark Mm and the substrate mark Mw from the detection result (detection signal) of the image by the detection unit 50 based on the calibration information. The relative position is determined for each mark pair including the mold mark Mm and the substrate mark Mw. The control unit CNT performs the alignment of the mold M and the substrate W based on the determined relative position so that the mold mark Mm and the substrate mark Mw are positioned at target relative position. The alignment step may include processing for adjusting the relative position of the pattern area of the mold M and the shot area of the substrate W and processing for deforming at least one of the mold M and the substrate W so as to reduce a shape difference between the pattern area and the shot area. In step S8, in a state where the mold M and the imprint material R on the substrate are in contact with each other, the curing unit 40 irradiates the imprint material R with light to cure the imprint material R (curing step). In step S9, the imprint head 10 increases the space between the mold M and the substrate W to separate the mold M from the cured imprint material R (demolding step). In step S10, the control unit CNT determines whether the shot area to be subjected to the imprint processing next (next shot area) is present on the substrate. In a case where the next shot area is present (YES in step S10), the processing proceeds to step S3. In a case where the next shot area is absent (NO in step S10), the processing ends.

Next, the processing of the alignment correction of the mold M and the substrate W by use of the mold reference mark Mrm is described with reference to steps C3 to C8 in FIG. 11. In step C3, the control unit CNT moves the substrate stage 20 to a position below the detection units 50 so that the mold mark Mm and the substrate mark Mw are disposed in the imaging field of view of each detection unit 50 (imaging unit 51) as illustrated in FIG. 1. At this time, the control unit CNT may move the detection units 50 in addition to (or in place of) the substrate stage 20 so that the mold mark Mm and the substrate mark Mw are disposed in the imaging field of view of each detection unit 50. In step C4, the control unit CNT sets an illumination condition of each detection unit 50 (illumination unit 52). For example, for use in the alignment step in the imprint processing, the control unit CNT acquires an illumination condition determined in advance based on the manufacturing process and the like, and sets the illumination condition to the detection unit 50 (illumination unit 52). In step C5, the control unit CNT causes the detection unit 50 to detect the moire image (reference image) formed by the mold mark Mm and the substrate mark Mw, acquires a detection signal from the detection unit 50 as a detection result, and stores the detection signal. In step C6, the control unit CNT causes the detection unit 50 to detect the image formed by the mold reference mark Mrm, acquires a detection signal from the detection unit 50 as a detection result, and stores the detection signal. The steps C5 and C6 may be performed in parallel. In step C7, the control unit CNT compares the detection result of the moire image (reference image) formed by the mold mark Mm and the substrate mark Mw with the detection result of the image formed by the mold reference mark Mrm. Then, the control unit CNT removes a change component of the detection result of the image formed by the mold reference mark Mrm from the detection result of the moire image formed by the mold mark Mm and the substrate mark Mw, and corrects the detection result of the moire image formed by the mold mark Mm and the substrate mark Mw. In step C8, the control unit CNT controls the alignment of the mold M and the substrate W based on an alignment correction result in step C7. For example, the control unit CNT determines the relative position (XY directions) of the mold mark Mm and the substrate mark Mw by removing the change component of the position (XY directions) of the mold reference mark Mrm. The position is determined for each mark pair including the mold mark Mm and the substrate mark Mw. The control unit CNT performs the alignment of the mold M and the substrate W based on the determined relative position so that the mold mark Mm and the substrate mark Mw are positioned at the target relative position. The alignment step may include processing for adjusting the relative position of the pattern area of the mold M and the shot area of the substrate W and processing for deforming at least one of the mold M and the substrate W so as to reduce a shape difference between the pattern area and the shot area.

According to the above-described exemplary embodiment, it is possible to reduce change in a measurement result of the relative position of the mold mark and the substrate mark caused by variation of the characteristic of the detection unit 50, and to determine the relative position of the mold and the substrate with high accuracy. Accordingly, it is possible to align the mold and the substrate with high accuracy.

A second exemplary embodiment is described. In the first exemplary embodiment, the example of the configuration using the mold reference mark Mrm provided to the mold M and the substrate reference mark area Mrw_area that is equivalent to the range of the substrate W corresponding to the position of the mold reference mark Mrm and the dimension of the mold reference mark Mrm is described.

Figure 12A:
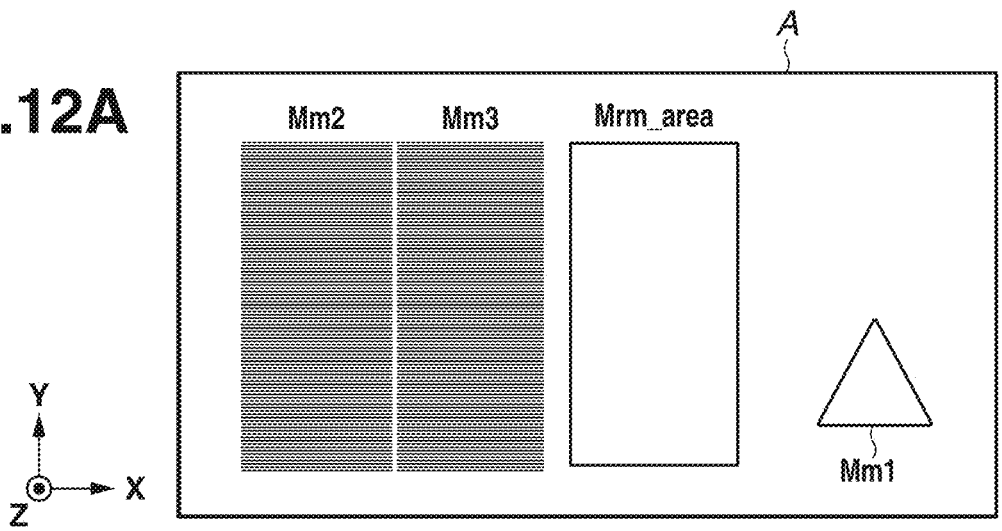
FIGS. 12A to 12C are diagrams illustrating configuration examples of marks according to a second exemplary embodiment.
Figure 12B:
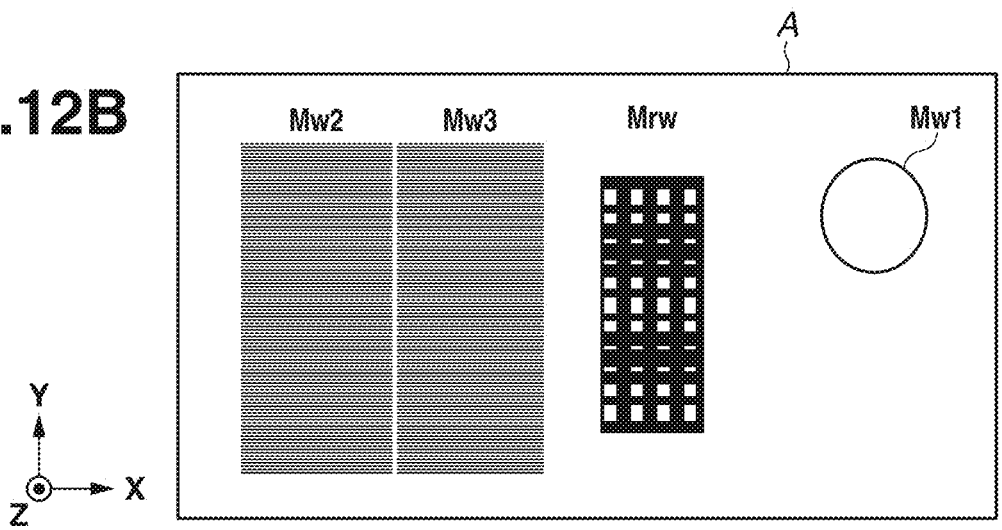
Figure 12C:
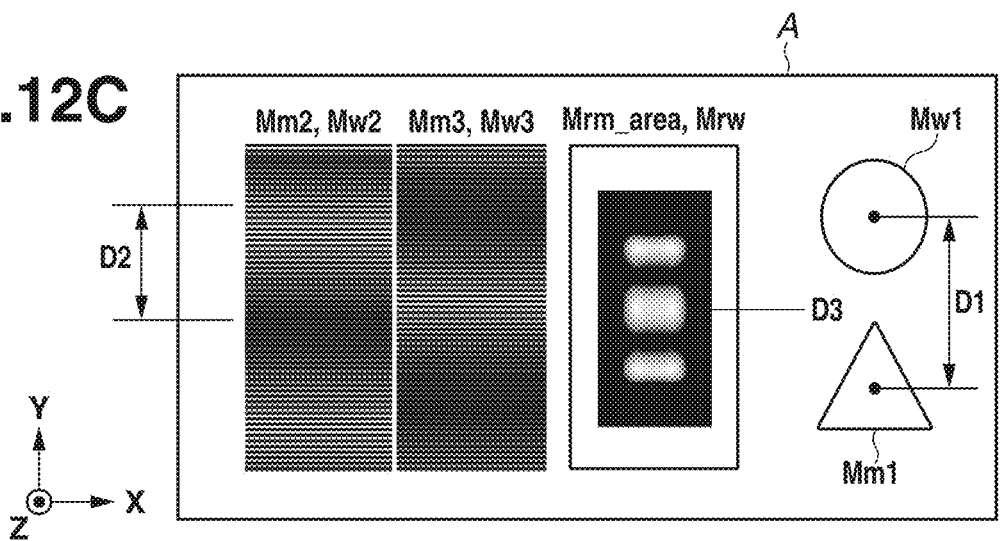

The present exemplary embodiment is different in the configuration of the reference mark from the first exemplary embodiment. In the present exemplary embodiment, an example of a configuration using a substrate reference mark Mrw provided in the substrate W and a mold reference mark area Mrm_area that is equivalent to a range of the mold M corresponding to a position of the substrate reference mark Mrw and a dimension of the substrate reference mark Mrw is described. The mold reference mark Mrm and the substrate reference mark Mrw may be equivalent to each other, and the mold reference mark area Mrm_area and the substrate reference mark area Mrw_area may be equivalent to each other. FIGS. 12A to 12C are diagrams illustrating configuration examples of the mold mark Mm and the substrate mark Mw. The outer frame A in FIGS. 12A to 12C is an imaging field of view of each detection unit 50 (imaging unit 51), and the detection unit 50 can detect (observe) a range within the outer frame A at a time. For example, the mold mark Mm in FIG. 12A may include, as mark elements, the rough detection mark Mm1 having any shape, the precise detection marks Mm2 and Mm3 each including a diffraction grating, and the mold reference mark area Mrm_area. The substrate mark Mw in FIG. 12B may include, as mark elements, the rough detection mark Mw1 having any shape, the precise detection marks Mw2 and Mw3 each including a diffraction grating, and the substrate reference mark Mrw. The mold reference mark area Mrm_area indicates an area where a pattern is not to be formed in the range of the mold M corresponding to the position of the substrate reference mark Mrw and the dimension of the substrate reference mark Mrw when the mold mark Mm and the substrate mark Mw are detected. FIG. 12C illustrates a state where the mold M and the substrate W are brought close to each other and the positions of the mold mark Mm and the substrate mark Mw are measured. The control unit CNT can determine a period of a sine-wave signal (detection signal) by using an image of the substrate reference mark Mrw captured by the imaging element 57. The period of the sine-wave signal of the substrate reference mark Mrw imaged by the imaging element 57 is determined from the period of the sinusoidally-changed duty ratio of the line width and the pitch of the substrate reference mark Mrw. Accordingly, the control unit CNT can evaluate the optical magnification that is one of the optical performances of the detection unit 50 from the period of the sine-wave signal of the substrate reference mark Mrw actually formed on the imaging element 57. In this example, in particular, the magnification of the imaging unit 51 (image-forming optical system) of the detection unit 50 can be evaluated. In addition, when the sine-wave signal of the substrate reference mark Mrw is imaged by the imaging element 57 a plurality of times, reproducibility of measurement that is one of the optical performances of the detection unit 50 can be evaluated from variation of the phase of the sine-wave signal.

A third exemplary embodiment is described. In the first exemplary embodiment, when the mold mark Mm and the substrate mark Mw are detected, the pattern is not formed in the substrate reference mark area Mrw_area of the substrate W corresponding to the position of the mold reference mark Mrm and the dimension of the mold reference mark Mrm. This may reduce unnecessary light from the base of the substrate W and/or the peripheral circuit pattern at the time of detection of the mold reference mark Mrm. In this case, however, a circuit area formed on the substrate may be reduced.

Thus, in the present exemplary embodiment, as the rough detection mark Mm1 of the mold mark Mm and/or the rough detection mark Mw1 of the substrate mark Mw, the mold reference mark Mrm and the substrate reference mark Mrw that are marks for evaluation of the detection unit 50 are used. FIGS. 13A to 13C are diagrams illustrating configuration examples of the mold mark Mm and the substrate mark Mw. The outer frame A in FIGS. 13A to 13C is an imaging field of view of each detection unit 50 (imaging unit 51), and the detection unit 50 can detect (observe) a range within the outer frame A at a time. For example, the mold mark Mm in FIG. 13A may include, as mark elements, the mold reference mark Mrm in FIG. 9A configured as a rough detection mark, and the precise detection marks Mm2 and Mm3 each including a diffraction grating. The substrate mark Mw in FIG. 13B may include, as mark elements, the substrate reference mark Mrw equivalent to the mold reference mark Mrm in FIG. 9A configured as the rough detection mark, and the precise detection marks Mw2 and Mw3 each including a diffraction grating. FIG. 13C illustrates a state where the mold M and the substrate W are brought close to each other and the positions of the mold mark Mm and the substrate mark Mw are measured. The rough relative position D1 of the mold mark Mm and the substrate mark Mw can be determined based on a geometric center position D3 of the mold reference mark Mrm and a geometric center position D4 of the substrate reference mark Mrw. An intensity ratio may occur between captured mark images due to difference between a reflectance of the mold reference mark Mrm and a reflectance of the substrate reference mark Mrw. In the case of a large intensity ratio, when intensity of illumination light is adjusted so that the mark image having a weak intensity has a proper intensity, the mark image having a strong intensity is saturated, and a measurement error may occur. Therefore, the intensity ratio between the two mark images is to be suppressed by, for example, adjustment of a light quantity from each light source. The pattern configuration of the mold reference mark Mrm, the pattern configuration of the substrate reference mark Mrw equivalent to the mold reference mark Mrm, and the detection principle are as described above.

The control unit CNT can determine the period of the sine-wave signal (detection signal) by using the images of the mold reference mark Mrm and the substrate reference mark Mrw captured by the imaging element 57. The period of the sine-wave signal of each of the mold reference mark Mrm and the substrate reference mark Mrw imaged by the imaging element 57 is determined from the period of the sinusoidally-changed duty ratio of the line width and the pitch of each of the mold reference mark Mrm and the substrate reference mark Mrw. Accordingly, the control unit CNT can evaluate the optical magnification that is one of the optical performances of the detection unit 50 from the period of the sine-wave signal of each of the mold reference mark Mrm and the substrate reference mark Mrw actually formed on the imaging element 57. In this example, in particular, the magnification of the imaging unit 51 (image-forming optical system) of the detection unit 50 can be evaluated. In addition, when the sine-wave signal of each of the mold reference mark Mrm and the substrate reference mark Mrw is imaged by the imaging element 57 a plurality of times, reproducibility of measurement that is one of the optical performances of the detection unit 50 can be evaluated from variation of the center position (phase) D3 and/or the center position (phase) D4 of the sine-wave signal. In the above-described manner, the detection unit 50 detects the above-described mold reference mark Mrm and/or the substrate reference mark Mrw, which makes it possible to evaluate the optical performances of the detection unit 50. As described above, the configuration including the mold reference mark Mrm and the substrate reference mark Mrw as the rough detection marks makes it possible to reduce areas occupied by the marks and to prevent reduction in the circuit area formed on the substrate.

A fourth exemplary embodiment is described. In the present exemplary embodiment, as illustrated in FIGS. 14A to 14C, the mold reference mark Mrm is used as the rough detection mark of the mold mark Mm, and the rough detection mark Mw1 having any shape is used as the rough detection mark of the substrate mark Mw. In the present exemplary embodiment, the rough relative position D1 of the mold mark Mm and the substrate mark Mw is detected by use of the mold reference mark Mrm configured as the rough detection mark and the rough detection mark Mw1.

The outer frame A in FIGS. 14A to 14C is an imaging field of view of each detection unit 50 (imaging unit 51), and the detection unit 50 can detect (observe) a range within the outer frame A at a time. For example, the mold mark Mm in FIG. 14A may include, as mark elements, the mold reference mark Mrm in FIG. 9A configured as the rough detection mark, and the precise detection marks Mm2 and Mm3 each including a diffraction grating. The substrate mark Mw in FIG. 14B may include, as mark elements, the rough detection mark Mw1 having any shape, the precise detection marks Mw2 and Mw3 each including a diffraction grating, and the substrate reference mark area Mrw_area. FIG. 14C illustrates a state where the mold M and the substrate W are brought close to each other and the positions of the mold mark Mm and the substrate mark Mw are measured. The rough relative position D1 of the mold mark Mm and the substrate mark Mw can be determined based on the geometric center position D3 of the mold reference mark Mrm configured as the rough detection mark of the mold mark Mm and the geometric center position of the rough detection mark Mw1.

Figure 15A:
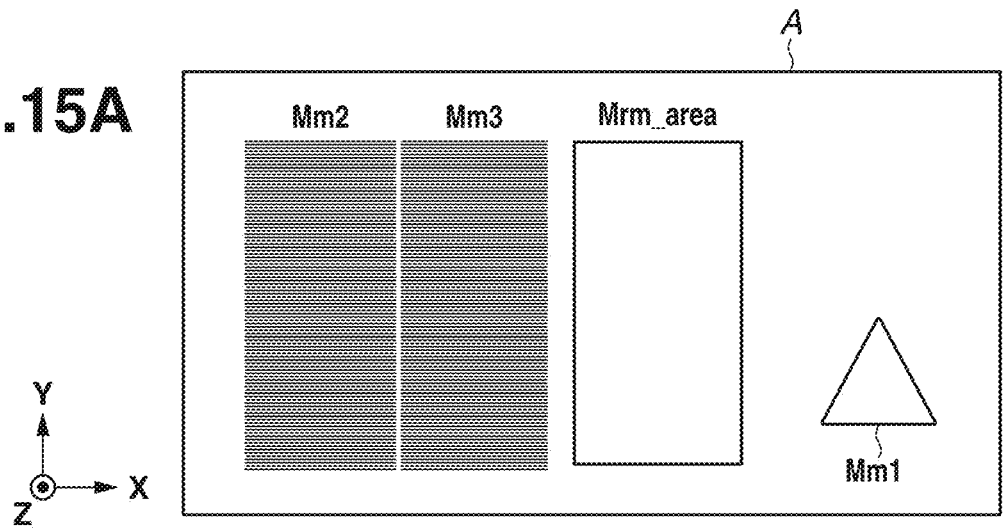
FIGS. 15A to 15C are diagrams illustrating configuration examples of the marks according to the fourth exemplary embodiment.
Figure 15B:
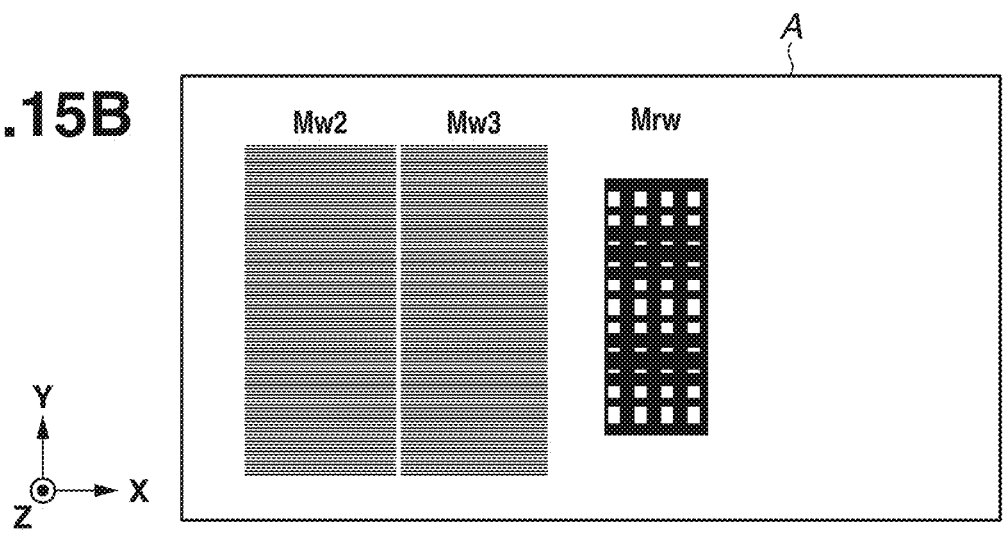
Figure 15C:
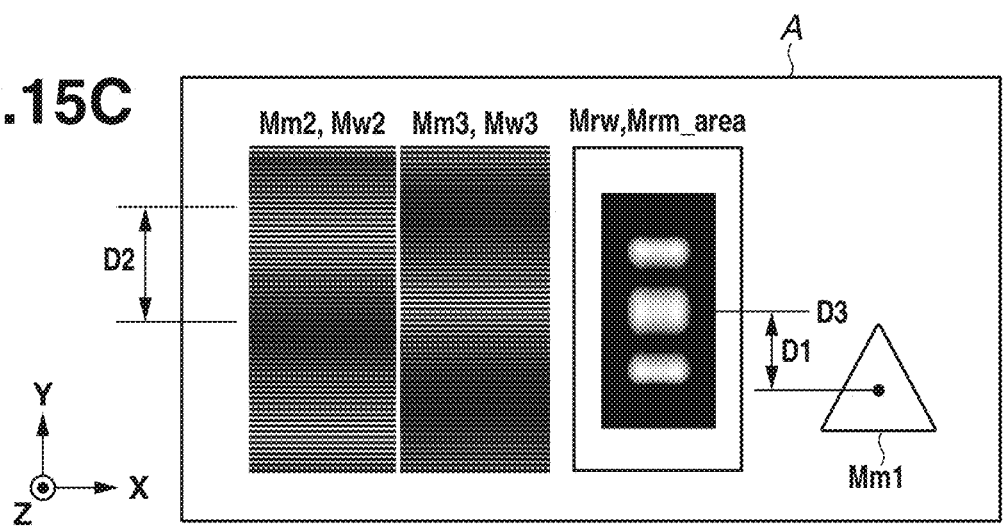

The configurations of the rough detection marks may be reversed between the mold mark and the substrate mark. The rough relative position D1 of the mold mark Mm and the substrate mark Mw may be determined by use of the substrate reference mark Mrw configured as the rough detection mark of the substrate mark Mw and the rough detection mark Mm1 having any shape and configured as the rough detection mark of the mold mark Mm illustrated in FIGS. 15A to 15C.

While the exemplary embodiments of the present disclosure are described above, the present invention is not limited to these exemplary embodiments, and various modifications and changes can be made within the scope of the gist of the present disclosure. In the above-described exemplary embodiments, the imprint apparatus is described; however, the above-described exemplary embodiments are also applicable to a case where a relative position of two objects, other than the imprint apparatus, is detected.

<Exemplary Embodiment of Article Manufacturing Method>

An article manufacturing method according to the present exemplary embodiment is suitable to manufacture an article, for example, a microdevice such as a semiconductor device and an element including a microstructure. The article manufacturing method according to the present exemplary embodiment includes a step of forming a pattern on an imprint material supplied (applied) to a substrate by use of the above-described imprint apparatus (imprint method), and a step of processing the substrate on which the pattern is formed in the step of forming. The article manufacturing method further includes other known steps (e.g., oxidation, film formation, vapor deposition, doping, planarization, etching, resist peeling, dicing, bonding, and packaging). The article manufacturing method according to the present exemplary embodiment is advantageous in at least one of performance, quality, productivity, and production cost of the article, compared with an existing method.

The pattern of the cured material shaped by use of the imprint apparatus is permanently used as at least a part of various kinds of articles, or is temporarily used when various kinds of articles are manufactured. Examples of the article include an electric circuit element, an optical element, micro electro mechanical systems (MEMS), a recording element, a sensor, and a mold. Examples of the electric circuit element include a volatile or nonvolatile semiconductor memory such as a dynamic random access memory (DRAM), a static RAM (SRAM), a flash memory, and a magnetoresistive RAM (MRAM), and a semiconductor element such as a large-scale integration (LSI), a charge-coupled device (CCD), an image sensor, and a field programmable gate array (FPGA). Examples of the mold include a mold for imprinting, and a plate-like mold having a flat surface.

The pattern of the cured material is used as it is as at least a partial component of the article, or is temporarily used as a resist mask. After etching, ion injection, or the like is performed in a substrate processing step, the resist mask is removed.

Figure 16A:
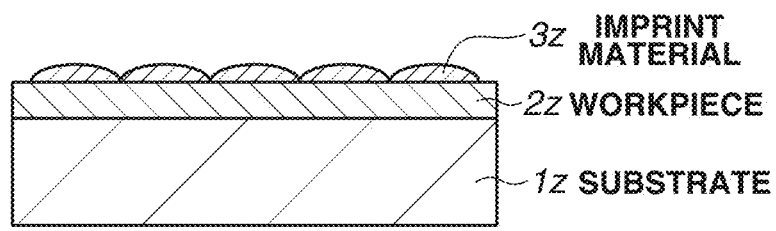
FIGS. 16A to 16F are diagrams illustrating an article manufacturing method.

Next, a specific article manufacturing method is described. As illustrated in FIG. 16A, a substrate 1z such as a silicon wafer including, on a surface thereof, a workpiece 2z such as an insulator is prepared. Subsequently, an imprint material 3z is applied to a surface of the workpiece 2z by an inkjet method or the like. In this example, a state where the imprint material 3z in a form of a plurality of liquid droplets is applied to the substrate 1z is illustrated.

Figure 16B:
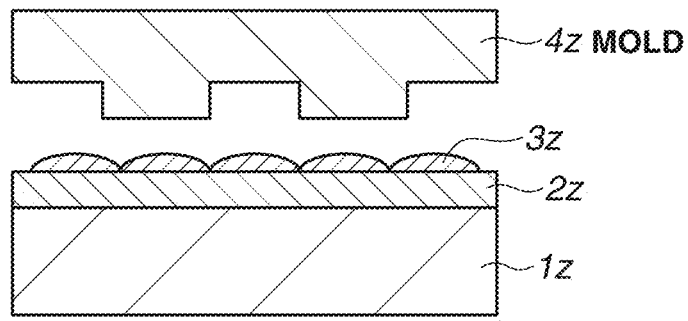
Figure 16C:
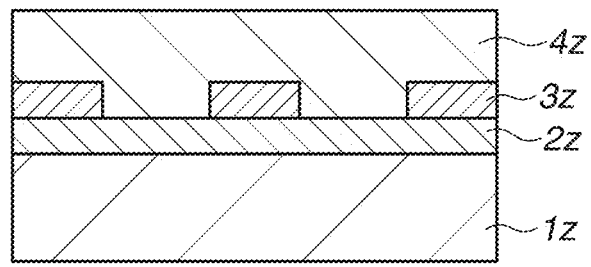

As illustrated in FIG. 16B, an imprint mold 4z is disposed so that a side provided with a depression-protrusion pattern faces the imprint material 3z on the substrate 1z. As illustrated in FIG. 16C, the substrate 1z to which the imprint material 3z has been applied and the mold 4z are brought into contact with each other, and pressure is applied thereto. A gap between the mold 4z and the workpiece 2z is filled with the imprint material 3z. In this state, when light as curing energy is applied through the mold 4z, the imprint material 3z is cured.

Figure 16D:
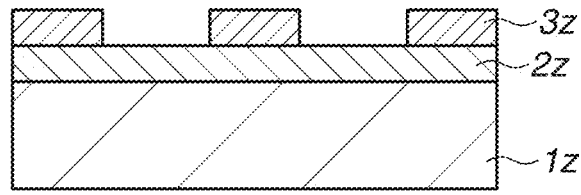

As illustrated in FIG. 16D, when the mold 4z and the substrate 1z are separated from each other after the imprint material 3z is cured, the pattern of the cured imprint material 3z is formed on the substrate 1z. The pattern of the cured material has a shape having a protruded portion corresponding to a depressed portion of the mold and a depressed portion corresponding to a protruded portion of the mold. In other words, the depression-protrusion pattern of the mold 4z is transferred to the imprint material 3z.

Figure 16E:
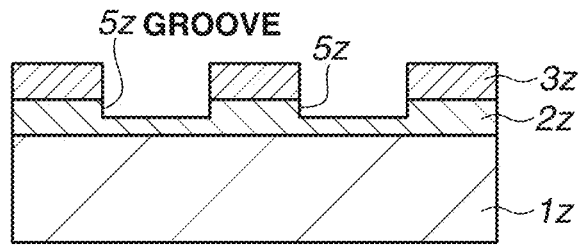
Figure 16F:
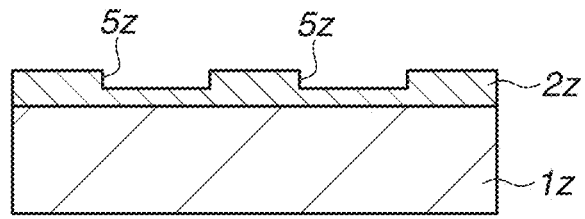

As illustrated in FIG. 16E, when etching is performed by use of the pattern of the cured material as an etching resistant mask, a portion of the surface of the workpiece 2z where the cured material is not present or a thin cured material remains is removed, and the portion becomes a groove 5z. As illustrated in FIG. 16F, when the pattern of the cured material is removed, an article in which the groove 5z is formed on the surface of the workpiece 2z can be obtained. In this example, the pattern of the cured material is removed; however, the pattern of the cured material may not be removed after the processing, and may be used as, for example, an interlayer insulation film included in a semiconductor element, namely, as a component of the article.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-040250, filed Mar. 15, 2022, which is hereby incorporated by reference herein in its entirety.

What is claimed is:

1. An alignment method of aligning a first object and a second object, the alignment method comprising:
   detecting a moire fringe formed by a mark of the first object and a mark of the second object by using a detection unit to acquire a detection result of the moire fringe;
   detecting an evaluation mark for correcting the detection result of the moire fringe, by the detection unit, and acquiring a detection result of the evaluation mark;
   determining a relative position of the mark of the first object and the mark of the second object by correcting the detection result of the moire fringe by use of the detection result of the evaluation mark; and aligning the first object and the second object based on the relative position,
wherein the evaluation mark is provided in at least one of the first object and the second object and has a plurality of pattern elements arranged with an interval not more than a resolution of the detection unit.

2. The alignment method according to claim 1, wherein the detection unit detects the moire fringe and the evaluation mark at a same time.

3. The alignment method according to claim 1, wherein the moire fringe and the evaluation mark are detected in a same field of view of the detection unit.

4. The alignment method according to claim 1,
wherein the evaluation mark is provided in each of the first object and the second object, and
wherein the evaluation mark of the first object and the evaluation mark of the second object do not overlap with each other.

5. An imprint method of forming a pattern on a composition on a substrate by use of a mold, the imprint method comprising:
aligning the mold as a first object and the substrate as a second object by the alignment method according to claim 1; and
forming a pattern on the composition by use of the aligned mold and the aligned substrate.

6. The imprint method according to claim 5,
wherein an evaluation mark for evaluation of a detection unit is provided on the mold, and
wherein the pattern is not formed in an area of the substrate overlapping the evaluation mark of the mold.

7. An article manufacturing method, comprising:
forming a pattern on a composition on a substrate by the imprint method according to claim 5; and
manufacturing an article by processing the substrate on which the pattern is formed.

8. A detection apparatus that detects a moire fringe formed by a mark of a first object and a mark of a second object, the detection apparatus comprising:
a detection unit configured to detect the moire fringe to acquire a detection result of the moire fringe; and
a calculation unit configured to determine a relative position of the mark of the first object and the mark of the second object by correcting the detection result of the moire fringe,
wherein an evaluation mark for correcting the detection result of the moire fringe is provided in at least one of the first object and the second object and has a plurality of pattern elements arranged with an interval not more than a resolution of the detection unit, and
wherein the calculation unit corrects the detection result of the moire fringe by use of a detection result of the evaluation mark by the detection unit.

9. An imprint apparatus that forms a pattern on a composition on a substrate by use of a mold, the imprint apparatus comprising:
the detection apparatus according to claim 8; and
a control unit configured to control alignment of the mold and the substrate,
wherein the detection apparatus determines a relative position of a mark of the mold as a first object and a mark of the substrate as a second object by correcting a detection result of a moire fringe formed by the mark of the mold and the mark of the substrate,
wherein the control unit performs the alignment of the mold and the substrate based on the relative position, and
wherein the pattern is formed on the composition by use of the aligned mold and the aligned substrate.

* * * * *